(12) United States Patent
Tao et al.

(10) Patent No.: US 8,740,400 B2
(45) Date of Patent: Jun. 3, 2014

(54) WHITE LIGHT ILLUMINATION SYSTEM WITH NARROW BAND GREEN PHOSPHOR AND MULTIPLE-WAVELENGTH EXCITATION

(71) Applicant: Intematix Corporation, Fremont, CA (US)

(72) Inventors: Dejie Tao, Fremont, CA (US); Yi-Qun Li, Danville, CA (US); Gang Wang, Milpitas, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 14/064,084

(22) Filed: Oct. 25, 2013

(65) Prior Publication Data
US 2014/0055982 A1 Feb. 27, 2014

Related U.S. Application Data

(63) Continuation-in-part of application No. 12/398,059, filed on Mar. 4, 2009, now Pat. No. 8,567,973.

(60) Provisional application No. 61/034,699, filed on Mar. 7, 2008.

(51) Int. Cl.
*F21V 9/16* (2006.01)
*F21Y 101/02* (2006.01)

(52) U.S. Cl.
CPC .............. *F21V 9/16* (2013.01); *F21Y 2101/02* (2013.01)
USPC ............................. 362/84; 362/231; 362/293

(58) Field of Classification Search
CPC ....... F21Y 2101/02; F21V 9/16; H01L 33/50; H01L 33/501; H01L 33/504; H01L 27/322
USPC ............ 362/84, 230, 231, 260; 313/485–487, 313/501, 503
See application file for complete search history.

(56) References Cited

U.S. PATENT DOCUMENTS

| 3,290,255 | A | 12/1966 | Smith |
| 3,593,055 | A | 7/1971 | Geusic et al. |

(Continued)

FOREIGN PATENT DOCUMENTS

| EP | 647694 | 4/1995 |
| GB | 2017409 | 10/1979 |

(Continued)

OTHER PUBLICATIONS

Naeshiro, et al., "Light-Emitting Device", English machine Translation of JP 2006128456, May 18, 2006, 13 pages.

(Continued)

*Primary Examiner* — Alan Cariaso
(74) *Attorney, Agent, or Firm* — David H. Jaffer; Pillsbury Winthrop Shaw Pittman LLP

(57) ABSTRACT

A white light illumination system may comprise: a phosphor package; a first radiation source for providing co-excitation radiation to the phosphor package, the source emitting in wavelengths ranging from about 250 nm to about 410 nm; and a second radiation source for providing co-excitation radiation to the phosphor package, the source emitting in wavelengths ranging from about 410 nm to about 540 nm; wherein the phosphor package is configured to emit photoluminescence in wavelengths ranging from about 440 nm to about 700 nm upon co-excitation from the first and second radiation sources, and wherein the phosphor package comprises at least one narrow band green phosphor with a photoluminescence peak with a full width at half maximum of less than 60 nm, and wherein the narrow band green phosphor is configured to emit photoluminescence in wavelengths ranging from about 500 nm to about 550 nm.

30 Claims, 22 Drawing Sheets

(56) References Cited

U.S. PATENT DOCUMENTS

| | | |
|---|---|---|
| 3,670,193 A | 6/1972 | Thorington et al. |
| 3,676,668 A | 7/1972 | Collins et al. |
| 3,691,482 A | 9/1972 | Pinnow et al. |
| 3,709,685 A | 1/1973 | Hercock et al. |
| 3,743,833 A | 7/1973 | Martie et al. |
| 3,763,405 A | 10/1973 | Mitsuhata |
| 3,793,046 A | 2/1974 | Wanmaker et al. |
| 3,819,973 A | 6/1974 | Hosford |
| 3,819,974 A | 6/1974 | Stevenson et al. |
| 3,849,707 A | 11/1974 | Braslau et al. |
| 3,875,456 A | 4/1975 | Kana et al. |
| 3,932,881 A | 1/1976 | Mita et al. |
| 3,937,998 A | 2/1976 | Verstegen et al. |
| 3,972,717 A | 8/1976 | Wiedemann |
| 4,047,075 A | 9/1977 | Schoberl |
| 4,081,764 A | 3/1978 | Christmann et al. |
| 4,104,076 A | 8/1978 | Pons |
| 4,143,394 A | 3/1979 | Schoberl |
| 4,176,294 A | 11/1979 | Thornton, Jr. |
| 4,176,299 A | 11/1979 | Thornton |
| 4,211,955 A | 7/1980 | Ray |
| 4,305,019 A | 12/1981 | Graff et al. |
| 4,315,192 A | 2/1982 | Skwirut et al. |
| 4,443,532 A | 4/1984 | Joy et al. |
| 4,559,470 A | 12/1985 | Murakami et al. |
| 4,573,766 A | 3/1986 | Bournay et al. |
| 4,618,555 A | 10/1986 | Suzuki et al. |
| 4,638,214 A | 1/1987 | Beers et al. |
| 4,667,036 A | 5/1987 | Iden et al. |
| 4,678,285 A | 7/1987 | Ohta et al. |
| 4,727,003 A | 2/1988 | Ohseto et al. |
| 4,772,885 A | 9/1988 | Uehara et al. |
| 4,845,223 A | 7/1989 | Seybold et al. |
| 4,859,539 A | 8/1989 | Tomko et al. |
| 4,915,478 A | 4/1990 | Lenko et al. |
| 4,918,497 A | 4/1990 | Edmond |
| 4,946,621 A | 8/1990 | Fouassier et al. |
| 4,992,704 A | 2/1991 | Stinson |
| 5,077,161 A | 12/1991 | Law |
| 5,110,931 A | 5/1992 | Dietz et al. |
| 5,126,214 A | 6/1992 | Tokailin et al. |
| 5,131,916 A | 7/1992 | Eichenauer et al. |
| 5,143,433 A | 9/1992 | Farrell |
| 5,143,438 A | 9/1992 | Giddens et al. |
| 5,166,761 A | 11/1992 | Olson et al. |
| 5,208,462 A | 5/1993 | O'Connor et al. |
| 5,210,051 A | 5/1993 | Carter et al. |
| 5,211,467 A | 5/1993 | Seder |
| 5,237,182 A | 8/1993 | Kitagawa et al. |
| 5,264,034 A | 11/1993 | Dietz et al. |
| 5,283,425 A | 2/1994 | Imamura |
| 5,369,289 A | 11/1994 | Tamaki et al. |
| 5,405,709 A | 4/1995 | Littman et al. |
| 5,439,971 A | 8/1995 | Hyche |
| 5,518,808 A | 5/1996 | Bruno et al. |
| 5,535,230 A | 7/1996 | Abe |
| 5,557,168 A | 9/1996 | Nakajima et al. |
| 5,563,621 A | 10/1996 | Silsby |
| 5,578,839 A | 11/1996 | Nakamura et al. |
| 5,583,349 A | 12/1996 | Norman et al. |
| 5,585,640 A | 12/1996 | Huston et al. |
| 5,619,356 A | 4/1997 | Kozo et al. |
| 5,660,461 A | 8/1997 | Ignatius et al. |
| 5,677,417 A | 10/1997 | Muellen et al. |
| 5,679,152 A | 10/1997 | Tischler et al. |
| 5,763,901 A | 6/1998 | Komoto et al. |
| 5,770,887 A | 6/1998 | Tadatomo et al. |
| 5,771,039 A | 6/1998 | Ditzik |
| 5,777,350 A | 7/1998 | Nakamura et al. |
| 5,869,199 A | 2/1999 | Kido |
| 5,959,316 A | 9/1999 | Lowery |
| 5,962,971 A | 10/1999 | Chen |
| 6,137,217 A | 10/2000 | Pappalardo et al. |
| 6,252,254 B1 * | 6/2001 | Soules et al. .............. 257/89 |
| 6,340,824 B1 | 1/2002 | Komoto et al. |
| 6,357,889 B1 * | 3/2002 | Duggal et al. ............... 362/84 |
| 6,504,301 B1 | 1/2003 | Lowery |
| 6,576,488 B2 | 6/2003 | Collins et al. |
| 6,577,073 B2 | 6/2003 | Shimizu et al. |
| 6,600,175 B1 | 7/2003 | Baretz et al. |
| 6,642,618 B2 | 11/2003 | Yagi et al. |
| 6,642,652 B2 | 11/2003 | Collins et al. |
| 6,805,600 B2 | 10/2004 | Wang et al. |
| 6,869,812 B1 | 3/2005 | Liu |
| 7,153,015 B2 | 12/2006 | Brukilacchio |
| 7,311,858 B2 | 12/2007 | Wang |
| 7,387,405 B2 | 6/2008 | Ducharme et al. |
| 7,476,338 B2 | 1/2009 | Sakane et al. |
| 7,479,662 B2 | 1/2009 | Soules et al. |
| 7,541,728 B2 | 6/2009 | Wang et al. |
| 7,564,180 B2 * | 7/2009 | Brandes ................... 313/501 |
| 7,615,795 B2 | 11/2009 | Baretz et al. |
| 7,654,681 B2 | 2/2010 | Kim et al. |
| 7,724,321 B2 * | 5/2010 | Hsieh et al. ............... 349/68 |
| 7,755,276 B2 | 7/2010 | Wang et al. |
| 7,918,581 B2 | 4/2011 | Van De Ven et al. |
| 7,937,865 B2 | 5/2011 | Li et al. |
| 7,943,945 B2 | 5/2011 | Baretz et al. |
| 8,071,988 B2 * | 12/2011 | Lee et al. ................... 257/88 |
| 8,274,215 B2 | 9/2012 | Liu et al. |
| 8,597,545 B1 | 12/2013 | Liu et al. |
| 8,684,555 B2 | 4/2014 | Hofmann et al. |
| 2003/0075705 A1 | 4/2003 | Wang et al. |
| 2004/0016938 A1 | 1/2004 | Baretz et al. |
| 2006/0027781 A1 | 2/2006 | Dong |
| 2006/0043337 A1 | 3/2006 | Sakane |
| 2006/0049416 A1 | 3/2006 | Baretz et al. |
| 2006/0067073 A1 | 3/2006 | Ting |
| 2006/0152140 A1 | 7/2006 | Brandes |
| 2007/0108455 A1 | 5/2007 | Sun et al. |
| 2007/0223219 A1 | 9/2007 | Medendorp |
| 2007/0258240 A1 | 11/2007 | Ducharme et al. |
| 2007/0278934 A1 | 12/2007 | Van De Ven et al. |
| 2008/0136313 A1 | 6/2008 | Van De Ven et al. |
| 2008/0203900 A1 | 8/2008 | Chen et al. |
| 2008/0224597 A1 | 9/2008 | Baretz et al. |
| 2008/0224598 A1 | 9/2008 | Baretz et al. |
| 2012/0287381 A1 | 11/2012 | Li et al. |
| 2013/0168605 A1 | 7/2013 | Li et al. |
| 2013/0234589 A1 | 9/2013 | Tao et al. |

FOREIGN PATENT DOCUMENTS

| | | |
|---|---|---|
| JP | S50-79379 | 11/1973 |
| JP | 60170194 | 9/1985 |
| JP | 882-189770 | 8/1987 |
| JP | H01-179471 | 7/1989 |
| JP | 01-26707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | H07-176794 | 7/1995 |
| JP | 07-235207 | 9/1995 |
| JP | H7-282609 | 10/1995 |
| JP | H08-7614 | 1/1996 |
| JP | 8-250281 | 9/1996 |
| JP | 2900928 | 3/1999 |
| JP | P2003-234513 | 8/2003 |
| JP | P3724490 | 9/2005 |
| JP | P3724498 | 9/2005 |
| JP | 2006128456 | 5/2006 |
| JP | 2007142389 | 6/2007 |
| WO | 91/08508 | 6/1991 |
| WO | 2005/109532 | 11/2005 |

(56) References Cited

FOREIGN PATENT DOCUMENTS

OTHER PUBLICATIONS

Commission Internationale de L'Eclairage (CIE) Technical Report 13.3, 1995, Method fo Measuring an dSpecifying Colour Rendering Properties fo Light Sources.
Yen, William, et al., Inorganic Phosphors, Section 8: Commercial Phosphors and Scintillators and Appendix II, 2004 CRC Press, New York.
Interanational Search Report and Written Opinion issued Apr. 20, 2009, in PCT/US2009/36214, 8 pages.
European Patent Office, Extended Search Report for EP 09718586.2, Oct. 21, 2011, 7 pages.
International Preliminary Report on Patentability dated Apr. 20, 2009 in PCT/US2009/036214.
Office Action in Chinese Patent Application No. 200980108036.9 dated Feb. 13, 2012.
Office Action in Chinese Patent Application No. 200980108036.9 dated Jan. 14, 2013.
Office Action in European Patent Application No. 09718586.2 dated Jan. 28, 2013.
CRC Handbook, 63$^{rd}$ Ed., 1983, p. E-201.
Lumogen F Violet 570 Data Sheet, available at the BASF Chemical Company website, http:// worldaacount.Basf.com/wa/EU_GB/Catalog/Pigments/doc4/ BASF/PRD/ 30048274/.pdt?title= Technicao% Datasheet &asset_type=pds/pdf& language=EN& urn=urn:documentatum: eCommerce_soi_EU: 09907bb280021327. pdf:09007bb280021e27.pdf.
Saleh and Teich, Fundamentals of Photonics, New York, 1991, pp, 592-594.
The Penguin Dictionary of Electronics, 3$^{rd}$ Ed., pp. 315, 437-438, 509-510, 1979-1998.
LEDs and Laser Diodes, Electus Distribution, 2001, available at http://www.jaycar.com.au/images_uploaded/ledlaser.pdf.
Fraunhofer-Gesellschafl: Research News Special 1997, http://www.fhg.de/press/md-e/mdl1997/sondert2.html (accessed Jul. 23, 1998), published 1997.
Krames, M. et al., Status and Future of High Power Light Emitting diodes for Solid State Lighting, J. of display Technology, Jun. 2007, pp. 160-175, vol. 3, No. 2.
Kudryashov, V., et al., "Spectra of Superbright blue and Green InGaN/AlGaN/GaN Light Emitting Diodes", J. of the EP Ceram. Soc., May 1996, pp. 2033-2037, vol. 17.
Lester, et al., "High Dislocation Densities in the High Efficiency GaN-based Light Emitting Diodes", App. Phys. Leets. Mar. 6, 1995, pp. 1249-1251, vol. 66, No. 10.
Mukai, et al., "Recent progress of Nitride-based emitting Devices", Phys. Stat. Sol, Sep. 2003, pp. 52-57, vol. 200, No. 1.
Nakamura, et al., "High Power InGaN Single Quantum Well Structure Blue and Violet Light emitting Diodes", App. Phys. Lett., Sep. 25, 1995, pp. 1868-1870, vol. 67, No. 13.
Nakamura, et al., "The Blue Laser Diode: GaN Based Light Emitters and Lasers",Mar. 21, 1997, p. 239.
Nakamura, et al., "The Blue Laser Diode: The complete Story", 2$^{nd}$ Rev. Ed., Oct. 2000, pp. 237-240.
Mar. 22, 2012 Office Action in U.S. Appl. No. 12/131,119 issued Steven Horikoshi.
Pei, et al., "Polymer Light-Emitting Electrochemical Cels", Science, Aug. 25, 1995, pp. 1086-1088, vol. 269, No. 5227.
Dictionary Definition of "Phosphor", Oxford English Dictionary, Mar. 9, 2012.
Feb. 21, 2012 Office Action in U.S. Appl. No. 12/131,118 issued by Abul Kalam.
Jan. 7, 2011 Office Action in U.S. Appl. No. 12/131,119 issued Steven Horikoshi.
May 4, 2010 Office Action in U.S. Appl. No. 12/131,119.
Jul. 7, 2011 Office Action in U.S. Appl. No. 12/131,118 issued Abul Kalam.
Jul. 14, 2011 Office Action in U.S. Appl. No. 12/131,119 issued Steven Horikoshi.
Aug. 26, 2010 Office Action issued in U.S. Appl. No. 12/131,118.
Sep. 29, 2009 Office Action issued in U.S. Appl. No. 11/264,124 by Abu Kalam.
Oct. 20, 2008 Office Action issued in U.S. Appl. No. 10/623,198 issued by Abu Kalam.
Nov. 30, 2010 Office Action issued in U.S. Appl. No. 12/131,118.
Dec. 16, 2004 Office Action issued in U.S. Appl. No. 10/623,198 by Thao Le.
Jan. 29, 2007 Office Action issued in U.S. Appl. No. 11/264,124 by Thao Le.
Feb. 4, 2005 Office Action issued in U.S. Appl. No. 10/623,198 by Thao Le.
Feb. 7, 2007 Office Action issued in U.S. Appl. No. 11/264,124 by Thao Le.
Feb. 26, 2008 Office Action issued I U.S. Appl. No. 11/264,124 by Abu Kalam.
Mar. 2, 2009 Office Action issued in U.S. Appl. No. 10/623,198 issued by Abu Kalam.
Mar. 4, 2011 Notice of Allowance and associated documents issued in U.S. Appl. No. 11/264,124 issued by Abu Kalam.
Mar. 7, 2008 Office Action issued in U.S. Appl. No. 10/623,198 by Abu Kalam.
Mar. 28, 2006 Office Action issued in U.S. Appl. No. 10/623,198 issued by Thao Le.
Apr. 15, 2009 Office Action issued in U.S. Appl. No. 11/264,124 issued by Abu Kalam.
Jun. 14, 2006 Office Action issued in U.S. Appl. No. 11/264,124 by Thao Le.
Jun. 26, 2007 Office Action issued in U.S. Appl. No. 10/623,198 issued by Thao Le.
Jul. 10, 2008 Office Action issued in U.S. Appl. No. 11/264,124 issued by Abu Kalam.
Jul. 14, 2005 Notice of Allowance and associated documents issued in U.S. Appl. No. 10/623,198 by Thao Le.
Aug. 21, 2006 Office Action issued in U.S. Appl. No. 10/623,198 issued by Thao Le.
Aug. 24, 2007 Office Action issued in U.S. Appl. No. 11/264,124 issued by Thao Le.
Sep. 17, 2009 Notice of Allowance and associated documents issued in U.S. Appl. No. 10/623,198 issued by Abu Kalam.
Amano, et al., "UV and Blue Electroluminescence from Al/GaN: Mg/GaN LED Treated with Low Energy Electron Beam Irridation" Inst. of Physics Conf Series, 1990, pp. 725-730, vol. 106, No. 10.
Roman, "LEDs Turn a Brighter Blue" Electronic Buyers News, Jun. 19, 1995, pp. 28 and 35, vol. 960.
Bradfield, et al., "Electroluminescence from Sulfur Impurities in a p-n Junction formed in epitaxial Silicon", Appl. Phys. Lett., 07110/1989 pp. 10D-102, vol. 55, No. 2.
Das, et al., "Luminesence Spectra of ann-Channel Metal-Oxide-Semiconductor Field-Effect Transistor at Breakdown", 1990, vol. 56, No. 12, pp. 1152-1153.
Jang, et al., "Effect of Avalanche-Induced Light Emissions on the Multiplication Factor in Bipolar Junction Transistors", Solid State Electronics, 1991, pp. 1191-1196, vol. 34, No. 11.
Pavan, et al., "Explanation of Current Crowding Phenomena Induced by Impact Ionization in Advanced Si Bipolar Transistors by Means of . . . ", Microelectronics Engineering, 1992, vol. 19, pp. 699-702.
Yang, et al., "Voltage Controlled Two Color Light Emitting Electochemical Cells," Appl. Phys, Lett., 1996, vol. 68, No. 19.
Zanoni, et al., "Measurements of Avalanche Effects and Light Emission in Advanced Si and SiSe BiPolar transistors", Microelectronic Engineering, 1991, pp. 23-36, vol. 15.
Zanoni, et al., "Impact Ionization, Recombination and Visible Light Emission in ALGaAs/GaAs High Electron Mobility Transistors", J. App. Phys., 1991, pp. 529-531, vol. 70, No. 1.
Zhiming, et al. "Amorphous Thin Film White-LED and its Light Emitting Mechanism", Conf. Record of the 1991 Inter'l Display Research Conf., Oct. 1991, pp. 122-125.

(56) References Cited

OTHER PUBLICATIONS

Apr. 14, 2010 Office Action issued in U.S. Appl. No. 11/264,124.

Adachi, et al., "Blue Light Emitting Organic Electroluminescent Devices", Appl. Phys. Lett., Feb. 26, 1990, pp. 799-801, vol. 56, No. 9.

Akasaki, et al., "Photoluminescence of Mg-Doped p-Type GaN and Electroluminescence of GaN p-n Junction LED", Journal of Luminescence, Jan.-Feb. 1991, pp. 666-670, vol. 48-49, No., Pt. 2.

Armaroli, et al., "Supramolecular Photochemistry and Photophysics", J. Am. Chem. Soc., 1994, pp. 5211-5217, vol. 116.

Berggren, et al., "White Light From an Electroluminescent Diode Made from Poly3(4-octylphenyl)-2-2",Bithiopene] and an Oxadiazole . . .", J. of App. Phys., Dec. 1994, pp. 7530-7534, vol. 76, No. 11.

Berggren, et al., "Light Emitting Diodes with Variable colours from Polymer Blends", Nature, Dec. 1, 1994, pp. 444-446, vol. 372.

Boonkosum, et al., "Novel Flat Panel Display Made of Amorphous SiN:H/SiC:H Thin Film LED", Phys. Concepts and Mats. For Novel Optoelectronic Device Applications II, 1993, pp. 40-51, vol. 1985.

Chao, et al., "White Light Emitting Glasses", J. of Solid State Chem., 1991, pp. 17-29, Vo.. 93.

Comrie, M., "Full Color LED Added to Lumex's Lineup", EBN, Nune 19, 1995, p. 28.

Zdnowski, "Pulse Operating Up Converting Phosphor LED", Electron Technol., 1978, pp, 49-61, vol. 11, No. 3.

Forrest, et al., "Organic Emitters Promise a New Generation of Displays", Laser Focus World, Feb. 1995, pp. 99-107.

Hamada, et al., "Blue Light Emitting Organic Electroluminescent Devices with Oxadiazole Dimer Dyes as an Emitter", Jpn. J. Appl, Phys., Jun. 1992, pp. 1812-1816, vol. 31.

Hamakawa, et al., "Toward a Visible Light Display by Amorphous SiC:H Alloy System", Optoelectronics—Devices and Technologies, Dec. 1989, pp. 281-294, vol. 4, No. 2.

Hirano, et al., "Various Performances of Fiber Optical Temperature Sensor . . . ", Electrochemistry, Feb. 1987, pp. 158-164, vol. 55, No. 2.

El Jouhari, et al., "White Light Generation Using flourescent Glasses Activated by Ce3+, Tb3+ and Mn2+ Ions", J. of De Physique IV, Solloque C2, Oct. 1992, pp. 257-260, vol. 2.

Kido, et al., "1,2,4-Triazole Derivative as an Electron Transport Layer in Organic Luminescent Devices", Jp. J. Appl. Phys, Jul. 1, 1993, pp. 917-920, vol. 32.

Kido, et al., "White Light Emitting Organic Electroluminescent Devices using the Poly(N-vinylcarbazole) Emitter Layers. Doped with . . . ", Appl. Phys. Lett., Feb. 14, 1994, pp. 815-817, vol. 64, No. 7.

Kido, et al., Bright Blue Electroluminescence from Poly(N-vinylcarbazole), Appl. Phys. Lett., Nov. 8, 1993, pp. 2637-2629, vol. 63; No. 19.

Larach, et al., "Blue Emitting Luminescent Phosphors: review and Status", International Workshop on Electroluminescence, 1990, pp. 137-143.

Maruska, et al., "Violet Luminescence of Mg-Doped GaN", Appl. Phys. Letts., Mar. 15, 1973, pp. 303-305, vol. 22, No. 6.

Maruska, et al., "Gallium Nitride Light Emitting Diodes", Dissertation submitted to Stanford University, Nov. 1973.

McGraw Hill Dictionary of Scientific and Technical Terms, 3d. Ed., 1984, pp. 912, and 1446.

McGraw Hill Dictionary of Scientific and Technical Terms, 6th Ed., 1987, pp. 60-63 and 582, vol. 9 and 10.

Mimura, et al., "Visible Electroluminescence from uc-SiC/ porous Si/c-Si p-n Junctions", Int, J. Optoelectron, 1994, pp. 211-215, vol. 9, No. 2.

Miura, et al., "Several Blue Emitting thin film Electraluminescent Devices", Jpn. J. Appl. Phys., Jan. 15, 1992, pp. L46-L48, vol. 31, No. Part 2, part 1AIB.

Muench, et al., "Silicon Carbide Light Emitting Diodes with Epitaxial Junctions", Solid State Electronics, Oct. 1976, pp. 871-874, vol. 19, No. 10.

Pankove, et al., "Scanning Electron Microscopy Studies of GaN", J. of Appl. Phys., Apr. 1975, pp. 1647-1652, vol. 46, No. 4.

Sato, et al., "Full Color Fluorescent Display Devices using a Near UV Light Emitting Diode", Jpn. J. of Appl. Phys., Jul. 1996, pp. L838-L839.

Tanaka, et al., "Bright White Light Electroluminescence Based on Nonradiative Energy Transfer in Ce- andEuDoped SiS thin Films", Appl. Phys. Letts., Nov. 1987, pp. 1661-1663, vol. 51, No. 21.

Tanaka, et al., "White Light Emitting Thin Film Electroluminescent Devices with SrS:Ce,Cl/ZnS: Mn Double Phosphor Layers",. Jpn, Appl. Phys., Mar. 20, 1986, pp. L225-L227, vol. 25, No. 3.

Ura, et al., "Recent Trends of Development of Silicon Monocarbide Blue Light Emission Diodes", Kinzoku, 1989, pp. 11-15, vol. 59, No. 9.

Werner, et al., "Higher Visibility for LEDs", IEEE Spectrum, Jul. 1994, pp. 30-39.

Wojciechowski, et al., "Infrared-to-Blue Up-converting Phosphor", Electron Technology, 1978, pp. 31-47, vol. 11, No. 3.

Yamaguchi, et al., "High-Brightness SiC blue LEDs and Their Application to Full Color LED Lamps", Optoelectronics-Devices and Technologies, Jun. 1992, pp. 57-67.

Yoshimi, et al., "Amorphous Carbon Basis Blue Light Electroluminescent Device", Optoelectronics-Devices and Technologies, Jun. 1992, pp. 69-81.

Morkoc, et al., "Large Band Gap SIC, 111-V Nitride and II-VI ZnSe-based Semiconductor Device Technologies", J. Appl. Phys., 76(3), p. 1, Mar. 17, 1994.

Re-Exam Office Action dated Sep. 20, 2010 for U.S. Appl. No. 90/010,940.

Re-Exam Office Action dated Mar. 3, 2011 for U.S. Appl. No. 90/010,940.

Re-Exam Office Action dated Nov. 7, 2011 for U.S. Appl. No. 90/010,940.

Re-Exam Office Action dated Jun. 26, 2012 for U.S. Appl. No. 90/010,940.

Re-Exam Office Action dated May 24, 2012 for U.S. Appl. No. 90/010,940.

Re-Exam Advisory Action dated Sep. 28, 2012 for U.S. Appl. No. 90/010,940.

Foreign Office Action dated Apr. 28, 2013 for Chinese Application No. 200980108036.9.

Foreign Office Action dated Jul. 9, 2013 for Japanese Application No. 2010-549890.

\* cited by examiner

WHITE LIGHT ILLUMINATION SYSTEM WITH NARROW BAND GREEN PHOSPHOR AND MULTIPLE-WAVELENGTH EXCITATION

CROSS REFERENCE TO RELATED APPLICATIONS

This application is a continuation-in-part of U.S. patent application Ser. No. 12/398,059 filed Mar. 4, 2009, which claims the benefit of priority to provisional application Ser. No. 61/034,699 filed Mar. 7, 2008, which applications are incorporated herein by reference in their entirety.

FIELD OF THE INVENTION

Embodiments of the present invention are directed in general to white light illumination systems with phosphor material including a narrow band green phosphor and multiple radiation sources for co-excitation of the phosphor material. More particularly, though not exclusively, embodiments of the invention concern white light illumination systems for color liquid crystal displays.

BACKGROUND OF THE INVENTION

Devices known as "white LED's" are relatively recent innovations designed to replace the conventional incandescent light bulb. It was not until LED's emitting in the blue/ultraviolet region of the electromagnetic spectrum were developed that it became possible to fabricate a white light illumination source based on an LED. Economically, white LED's have the potential to replace incandescent light sources (light bulbs), particularly as production costs fall and the technology develops further. In particular, the potential of a white light LED is believed to be superior to that of an incandescent bulb in lifetime, robustness, and efficiency. For example, white light illumination sources based on LED's are expected to meet industry standards for operation lifetimes of 100,000 hours, and efficiencies of 80 to 90 percent. High brightness LED's have already made a substantial impact on such areas of society as traffic light signals, replacing incandescent bulbs, and so it is not surprising that they will soon provide generalized lighting requirements in homes and businesses, as well as other everyday applications. The term "white LED" may be something of a misnomer as no LED emits "white light," but it is used throughout the art to describe a lighting system where a blue/UV LED provides energy to another component of the system, one or more phosphors, which emit light when excited by the pumping LED, and where the excitation radiation from the pumping LED is combined with the light from the phosphor(s) to produce the final white light "product."

As described in U.S. Pat. No. 7,476,338 to Sakane et al., there are in the art generally two approaches to providing LED-based white light illumination systems. In a conventional multi-chip type system the three primary colors are provided by red, green, and blue LEDs individually. A one-chip system comprises a blue LED in conjunction with a phosphor where the blue LED serves two purposes: the first being to excite the phosphor, and the second to contribute blue light which is combined with the light emitted by the phosphor to make the perceived white light combination.

According to Sakane et al. the one-chip type system has a preferable characteristic in that an LED-phosphor system can be dimensionally smaller than a multi-chip system, and simpler in design because the multiple drive voltages and temperature considerations of multiple LEDs do not have to be taken into account. Thus the cost to manufacture the system may be reduced. Further, by using a phosphor having a broad emission spectrum, the white emission from the system better approximates the spectrum of sunlight, and thus the color rendering properties of the system may be improved. For these reasons greater attention has been given to the one-chip rather than multiple-chip type systems.

The single-chip type systems may further be divided into two categories. In a first category, as alluded to earlier, light from a high luminescence blue LED and a phosphor emitting a yellow color as a result of excitation from the blue LED is combined, the white luminescence of the combined light obtained by using a complementary relation between the blue emission of the LED and the yellow emission of the phosphor. In the second category, the excitation source is an LED that emits in the near-ultraviolet or ultraviolet (UV) region of the spectrum, and the light from the phosphor package may include a blue-emitting phosphor, red-emitting phosphor, and green-emitting phosphor is combined to form white light. In addition to being able to adjust the color rendering properties of the white light with this type of system, an arbitrary emission color may also be produced by controlling the mixing ratios of the red, green, and blue photoluminescence.

The benefits of these single-chip systems are well appreciated in the art, but so too are their drawbacks when it comes to enhancing color rendering properties. For example, the white light emission from a typical one-chip system consisting of a blue LED and a yellow phosphor (such as YAG:Ce) is deficient in the longer wavelength side of the visible spectrum, resulting in a bluish white light appearance. The YAG:Ce yellow phosphor of the system does not help much in contributing to the needed 600 to 700 nm emission content, since its excitation band with the greatest efficiency is at about 460 nm, and the excitation range of this yellow phosphor is not particularly broad. Further disadvantages of this single-chip system are the disparities in the emission wavelength ranges of the blue LED, due in part to the manufacturing process, and if these deviate from the optimal excitation range of the YAG:Ce-based yellow phosphor, there results a loss of wavelength balance between the blue light and the yellow light.

There are also disadvantages to this second category of single-chip systems. White light illumination formed by combining the photoluminescence from a UV or near-UV excited red, green, and blue phosphor system is also deficient in the longer wavelengths because the excitation and emission efficiencies of the red phosphor are lower compared to that of the other phosphors in the package. The white LED designer therefore may have little choices available other than to increase the ratio of the red phosphor in the mixture relative to the blue and green phosphors. But this action may lead to an undesirable consequence: the ratio of the green phosphor to the others may now be insufficient and luminescence from the white LED may suffer. It would appear that a white color with high luminescence is difficult to obtain. And the color rendering properties are still nowhere near optimum as the red phosphor typically has a sharper emission spectrum than the others.

It is clear that multi-chip white light illumination systems suffer from disadvantages, not the least of which is a need for a plurality of voltage control systems and the increased heat production from the many individual chips needed to produce the white light's component colors. But each of the single-chip systems have their problems too, perhaps most notably being the inability to achieve an acceptable color rendering outcome. What is needed in the art is a white light illumination system with enhanced luminosity and color rendering, while at the same time achieving a balance with the need for more sophisticated drive and control systems.

Furthermore, there is a need for more power efficient illumination systems for Liquid Crystal Displays (LCD) that can meet the exacting industry specifications.

SUMMARY OF THE INVENTION

Embodiments of the present invention are directed toward illumination systems, typically white light illumination systems, comprising a multi-chip excitation source and a phosphor package comprising a narrow band green phosphor. Typically the multi-chip excitation source is a two-chip source comprising two LEDs; a UV to near UV-emitting LED and a blue-emitting LED for co-exciting the phosphor package.

According to further embodiments, a white light illumination system may comprise: a phosphor package; a first radiation source for providing co-excitation radiation to the phosphor package, the source emitting in wavelengths ranging from about 250 nm to about 410 nm; and a second radiation source for providing co-excitation radiation to the phosphor package, the source emitting in wavelengths ranging from about 410 nm to about 540 nm; wherein the phosphor package is configured to emit photoluminescence comprising light with wavelengths ranging from about 440 nm to about 700 nm upon co-excitation from the first and second radiation sources, and wherein the phosphor package comprises at least one narrow band green phosphor with a photoluminescence peak with a full width at half maximum of less than 60 nm, and wherein the narrow band green phosphor is configured to emit photoluminescence in wavelengths ranging from about 500 nm to about 550 nm. Furthermore, the narrow band green phosphor may have a composition given by the formula $M_a Eu_{1-a} Al_b O_c$, wherein: M is at least one divalent metal selected from the group consisting of Mg, Ca, Sr, Ba, Mn, Zn, Cu, Cd, Sm and Tm; $0 < a \leq 1.0$; $0.5 \leq b \leq 12.0$; and $1.75 \leq c \leq 19.0$. Yet furthermore, the narrow band green phosphor may be a BAM phosphor—for example, with a composition given by the formula $M_{1-x} Eu_x Mg_{1-y} Mn_y Al_{10} O_{17}$ wherein M is at least one alkaline earth metal, $0.01 < x \leq 1.0$, and $0.01 < y \leq 1.0$. Furthermore, the phosphor package may further comprise at least one phosphor selected from the group consisting of a blue emitting phosphor, a yellow-green emitting phosphor, an orange emitting phosphor, and a red emitting phosphor, including combinations thereof.

According to yet further embodiments, a white light illumination system may comprise: a phosphor package; a first radiation source for providing co-excitation radiation to the phosphor package, the source emitting in wavelengths ranging from about 250 nm to about 410 nm; and a second radiation source for providing co-excitation radiation to the phosphor package, the source emitting in wavelengths ranging from about 410 nm to about 540 nm; wherein the phosphor package is configured to emit photoluminescence comprising light with wavelengths ranging from about 440 nm to about 700 nm upon co-excitation from the first and second radiation sources, and wherein the phosphor package comprises a green phosphor with chromaticity coordinates CIE (x, y) within an area of CIE 1931 xy chromaticity diagram defined by a simple quadrilateral with vertices (0.120, 0.775), (0.230, 0.755), (0.360, 0.620) and (0.150, 0.650), in embodiments a simple quadrilateral with vertices (0.128, 0.768), (0.205, 0.753), (0.278, 0.660) and (0.150, 0.680), and in other embodiments a simple quadrilateral with vertices (0.135, 0.760), (0.180, 0.750), (0.195, 0.700) and (0.150, 0.710). Furthermore, the phosphor package may further comprise a red phosphor having chromaticity coordinates CIE (x, y) within an area of the CIE 1931 xy chromaticity diagram defined by a simple quadrilateral with vertices (0.61, 0.39), (0.70, 0.30), (0.68, 0.30) and (0.59, 0.39).

According to further embodiments, a photoluminescence color display may comprise: a display panel comprising a plurality of red, green and blue pixel areas; a white light illumination system; and a color filter plate located on a side of the display panel that is distal to the white light illumination system, wherein the color filter plate comprises at least one of: first filter areas corresponding to red pixel areas of the display that are operable to allow the passage of red light; second filter areas corresponding to green pixel areas of the display that are operable to allow the passage of green light; and third filter areas corresponding to blue pixel areas of the display that are operable to allow the passage of blue light; and wherein the white light illumination system comprises: a phosphor package; a first radiation source for providing co-excitation radiation to the phosphor package, the source emitting in wavelengths ranging from about 250 nm to about 410 nm; a second radiation source for providing co-excitation radiation to the phosphor package, the source emitting in wavelengths ranging from about 410 nm to about 540 nm; and wherein the phosphor package is configured to emit photoluminescence in wavelengths ranging from about 440 nm to about 700 nm upon co-excitation from the first and second radiation sources, and wherein the phosphor package comprises at least one narrow band green phosphor with a photoluminescence peak with a full width at half maximum of less than 60 nm, and wherein the narrow band green phosphor is configured to emit photoluminescence in wavelengths ranging from about 500 nm to about 550 nm.

According to yet further embodiments, a photoluminescence color display may comprise: a display panel comprising a plurality of red, green and blue pixel areas; an excitation source operable to generate excitation radiation for operating the display, said excitation source comprising: a first radiation source emitting in wavelengths ranging from about 250 nm to about 410 nm; and a second radiation source emitting in wavelengths ranging from about 410 nm to about 540 nm; a photoluminescence color-elements plate comprising at least one of: a first photoluminescence material corresponding to red pixel areas of the display that is operable to emit red light in response to said excitation radiation; a second photoluminescence material corresponding to green pixel areas of the display that is operable to emit green light in response to said excitation radiation; and a third photoluminescence material corresponding to blue pixel areas of the display that is operable to emit blue light in response to said excitation radiation; and a color filter plate located on a side of the display panel that is distal to the white light illumination system, wherein the color filter plate comprises at least one of: first filter areas corresponding to red pixel areas of the display that are operable to allow the passage of red light; second filter areas corresponding to green pixel areas of the display that are operable to allow the passage of green light; and third filter areas corresponding to blue pixel areas of the display that are operable to allow the passage of blue light; wherein the second photoluminescence material comprises at least one narrow band green phosphor with a photoluminescence peak with a full width at half maximum of less than 60 nm, and wherein the narrow band green phosphor is configured to emit photoluminescence in wavelengths ranging from about 500 nm to about 550 nm.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1:
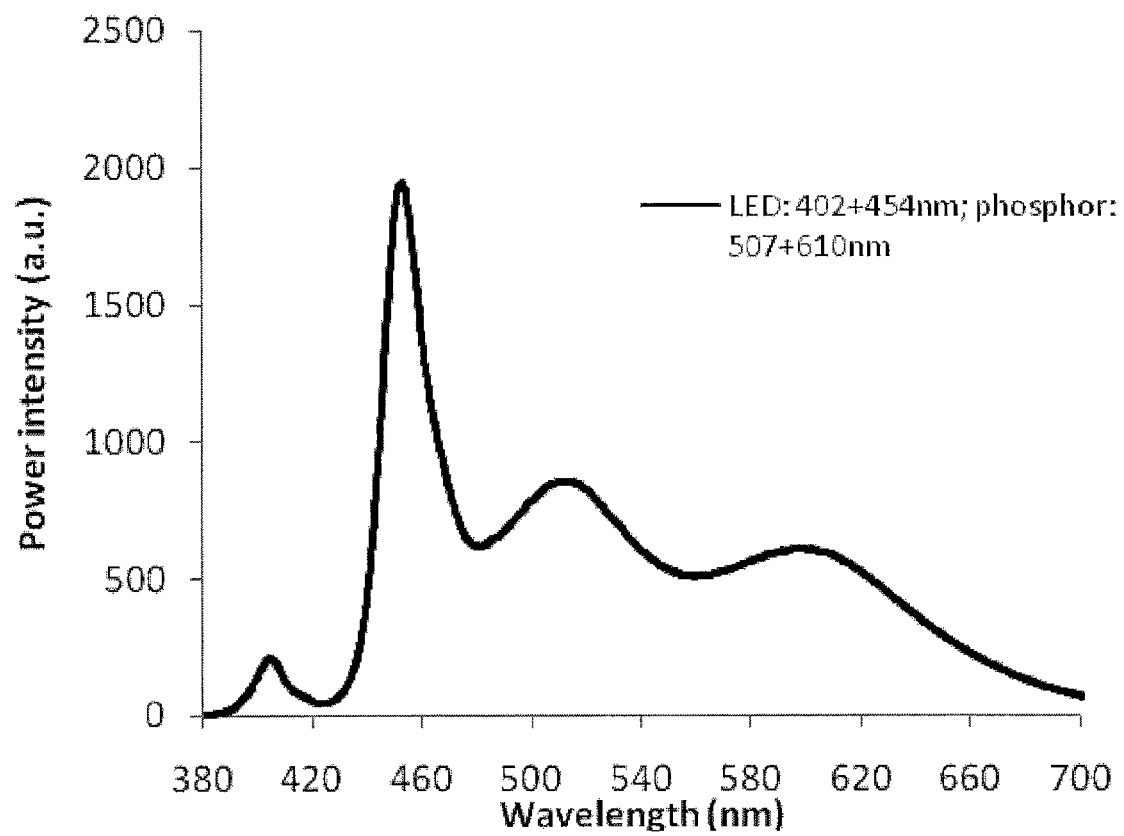
FIG. 1 is a plot of emission intensity versus wavelength for a two-LED radiation source providing excitation radiation to a two-phosphor system, the LEDs emitting at 402 and 454 nm, and the phosphors having peak emission intensities at 507 and 610 nm, respectively.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In one embodiment of the invention, the white LED is comprised of two radiation sources and at least two phosphors types chosen from blue, green, yellow, orange or red. The relative intensity of the two radiation sources can be equal, or tuned to a special ratio to optimize the final LED performance, such as the brightness, efficiency, color and the color rendering index (CRI).

Characterization of Light, Including White Light

One type of classification system developed to characterize the quality of white light was developed in 1965 by the Commission Internationale de l'Eclairage (CIE), and a summary of their recommendations has been reviewed by Ducharme et al. in U.S. Pat. No. 7,387,405. The CIE advised a measuring the color rendering properties of light sources based on a sample test color method. This method has been updated and is described in the CIE 13.3-1995 technical report titled "Method of Measuring and Specifying Color Rendering Properties of light sources," the disclosure of which is hereby incorporated by reference. In essence, the method involves the spectroradiometric measurement of the light source being tested. This data is multiplied by the reflectance spectrums of eight color sample. The resulting spectrums are then converted to tristimulus values based on the CIE 1931 standard observer. The shift of these values with respect to a reference light are determined for the uniform color space (UCS) recommended in 1960 by the CIE. The average of the eight color shifts is calculated to generate the General Color Rendering Index, known as the CRI. Within these calculations the CRI is scaled so that a perfect score equals 100, where "perfect" means using a source spectrally equal to a reference source (often sunlight and/or full spectrum light).

Artificial lighting generally uses the standard CRI to determine the quality of white light. If a white light yields a high CRI compared to sunlight and/or a full spectrum light, then it is considered to have a better quality in that it is more "natural," and more likely to enable a colored surface to better rendered. But in addition to providing better quality white light, it is also highly desirable to generate specific colors of light. Light tends to be more orange to red in the morning, and more blue in the night or evening, so the ability to change, fine-tune, or control a specific color or range of colors within the full spectrum is also important.

As taught by Ducharme et al. in U.S. Pat. Publication 2007/0258240, white light is a mixture of different wavelengths of light, and thus it is possible to characterize it based on the component colors used to generate it. Different colors may be combined to generate white light, including but not limited to: 1) red, green, and blue, 2) light blue, amber, and lavender, and 3) cyan, magenta, and yellow. In fact, a combination of only two colors may be combined to generate light that still appears white to the eye if these two chosen colors are so-called complementary, and an example of this is narrow band sources (LEDs, or in the extreme case, lasers) emitting around 635 nm and 493 nanometers. These artificial whites may appear white to the human eye, but in other ways inferior to full spectrum light and/or natural sunlight in that they will appear artificial when shown on a colored surface. The reason this happens is the colored surface under examination absorbs and reflects wavelength regions differentially. If such a surface is hit by full spectrum white light or natural sunlight, which means light having component wavelengths in the visible band fully represented at reasonable and/or desired intensities, the surface will absorb and reflect perfectly. But the artificial white lights described in this paragraph having only two or three components do not contain the complete spectrum. To give an example of what different color rendering means in two different situations: a surface that reflects in the 500 to 550 nm range will appear deep-green under full spectrum light, but black under the hypothetical "white light" generated by the hypothetical two component system comprising two narrow band sources emitting at around 635 nm and 493 nanometers.

Optical Results

Figure 2:
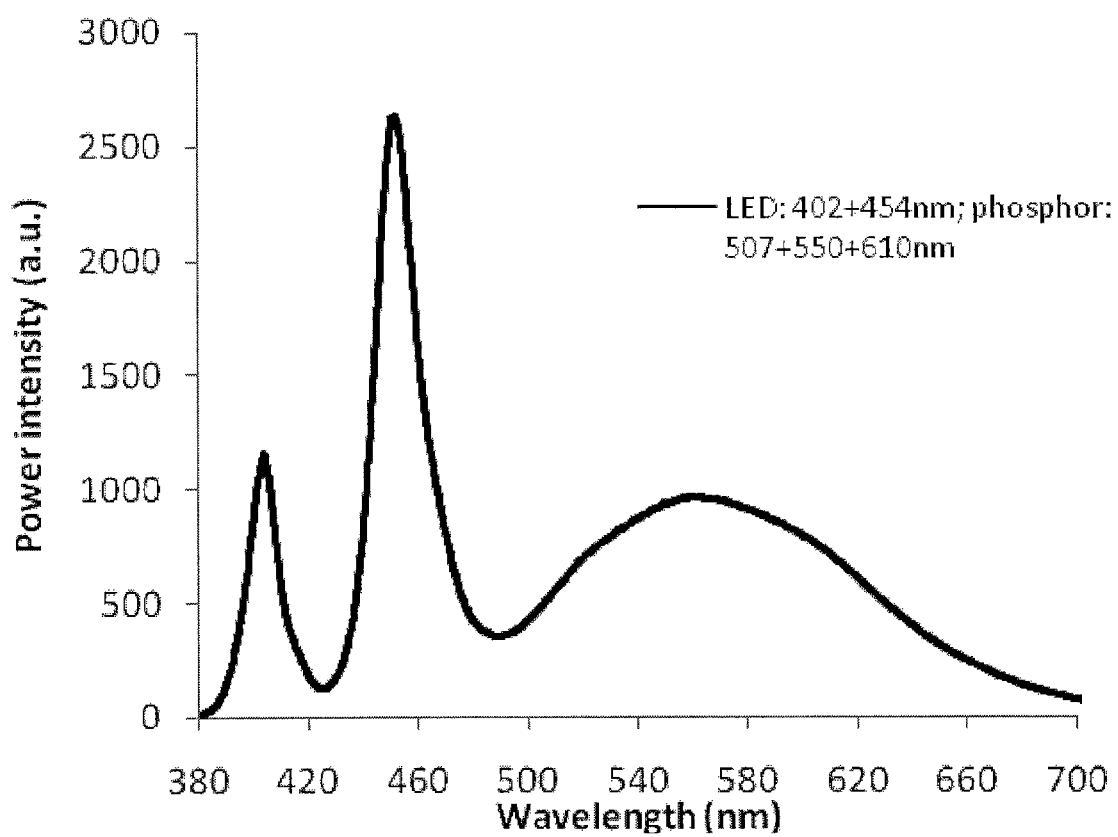
FIG. 2 is a plot of emission intensity versus wavelength for a two-LED radiation source providing excitation radiation to a three-phosphor system, the LEDs emitting at 402 and 454 nm, and the phosphors having peak emission intensities at 507, 550, and 610 nm, respectively.

The optical results to be discussed in this section will be quantified by way of graphs that plot emission intensity of the system as a function of spectral wavelength. It is, in fact, convenient to start with the spectrum of a conventional blue LED plus yellow YAG:Ce phosphor, as exemplified by Chen et al. in U.S. Pat. Publication 2008/0203900. Their FIG. 1 shows that the spectrum is deficient in red but especially so in the green. They suggest adding LEDs that preferably emit light in the blue-green region of the spectrum; i.e. 480 to 500 nm, and in the amber-red region of the spectrum; i.e. 580 to 680 nm. Their FIG. 2 shows a spectrum that is obtained by adding a blue-green LED having a center wavelength of approximately 500 nm to the white light system whose elimination was shown in their FIG. 1.

The addition of this LED by Chen et al. produces a spectrum that is substantially more constant in luminosity as a function of wavelength than that of the two component blue LED and yellow phosphor (e.g. YAG:Ce) system. The spectrum from a three LED—one phosphor system is shown in their FIG. 3, where a third LED emitting from 580 to 680 nm has been added to the system. The intensity of this spectrum over a range 450 to 650 nm is substantially more constant than the single LED/single phosphor (e.g., blue LED/YAG:Ce yellow phosphor) or two component version of a white LED. The power in the second, blue-green LED and/or third, orange-red LED is a small fraction of the power in the first blue LED that provides blue light as well as excitation radiation to the yellow phosphor, and thus the overall efficiency of the system has only been slightly reduced, yet the overall color rendering ability of the three component system has been enhanced. Thus multiple LEDs have been shown to be effective from an overall efficiency point of view.

Though LEDs in addition to the traditional blue LED have been used in white light illumination systems, these supplementary LEDs are used to provide a component of light to the final white light product, and (to the inventors knowledge) not to provide an additional source of excitation radiation. The term "co-excitation" as used herein will mean that at least two different LEDs provide a combined excitation radiation covering two different wavelengths or wavelength ranges to a phosphor and/or phosphor mixture (also called phosphor package), which may include two or more phosphors. The at least two LEDs each provides excitation radiation to the phosphor package, and may include a combination of any of a UV or near-UV LED and a blue, green, or yellow LED, and even an orange LED if it is configured to excite a red phosphor. In fact, that is a principle of the embodiments of the present invention: an LED may be used to excite any phosphor whose excitation energy is equal to or less than the bandgap energy of the LED in question, or stated more generally, an LED emitting at a certain wavelength may excite a phosphor whose luminescence is at a wavelength lower in energy than that of the LED's emission. So a green LED, for example, may be used to excite a yellow phosphor, or perhaps more efficiently, an orange or red phosphor, this event happening in conjunction with the conventional blue LED exciting a yellow phosphor (and possibly also a green, orange or red phosphor, etc.).

The first three examples of the present embodiments are directed to a system comprising two excitation LEDs: the first radiation source emitting excitation radiation to a phosphor package in wavelength ranging from about 250 to 410 nm, and thus it might be considered a UV to near-UV LED, and a second radiation source in emitting light in a wavelength ranging from 410 to 480 nm, and so this excitation source is substantially the same as the conventional blue LED used in blue LED/yellow phosphor systems. The phosphor mixtures tested with this two-LED excitation configuration are built up in the following manner: in the first example the phosphor package is a green and an orange phosphor, in the second example it is a green, yellow, and orange phosphor, and in the third example it is a blue, green, yellow, and orange phosphor. The members of this phosphor package each emit in the 440 to 700 nm wavelength range. The innovative concept in this embodiment is the use of a UV excitation LED in addition to the conventional blue LED, both LEDs simultaneously providing excitation radiation to the phosphors. With regards to the phosphor package to which the UV and blue LED sources are providing excitation radiation, a wide variety of choices are available. But some phosphors, such as silicate-based phosphor having high quantum efficiency as the excitation wavelength decreases from 470 to 250 nm as taught by the inventors of the present disclosure, result in an enhanced luminosity (brightness) achieved via the UV light source. Another advantage of using UV light source is that a phosphor with a shorter emission wavelength may be used to effectively absorb the UV light rather than the blue light from the excitation sources, such that the luminescence spectrum of the final product may cover a broader range of wavelengths, thus increasing the CRI value.

The results of the UV and blue LED excitation chips used in conjunction with a green phosphor designated G507 and an orange phosphor designated O610 are shown in FIG. 1. More will be said about the phosphors, particularly their compositions, later in this disclosure, but for now it will be noted that in this nomenclature, the letter is the color, and the number represents the wavelength at peak emission for that particular phosphor. The relative ratio of two phosphors was chosen to achieve a target CIE having x, y values close to (0.3, 0.3). So that other chip combinations and phosphor mixtures may be compared in a meaningful manner, the same CIE targets were chosen for the remaining nine examples. Thus brightness and CRI may be directly compared. In this first example the brightness was 31.32, and the CRI was 91.8, which shows immediately that color renderings over 90 CRI may be achieved with the present embodiments.

In the second example a yellow phosphor designated Y550 was added to the green and orange mix (G507 and O610, respectively) discussed previously in the first example. FIG. 2 shows the emission spectrum from a white LED utilizing the same UV and blue LED chip sources from the first example (402 nm and 454 nm). This time blue/UV LEDs co-exciting a yellow, green, and orange phosphor package produced white light illumination with more than a 30% increase in brightness. This increase in brightness was achieved via the addition of the yellow phosphor, as substantially all the other variables of the experiments were held constant. The white light produced in this second example may be characterized as having a brightness of 40.64, and a CRI of 80.7.

Unlike the first example that involved a mixture of two phosphors, in this second embodiment with a three-phosphor mixture in the phosphor package, there is created an essentially infinite number of blending ratios that can achieve the same target CIE. Generally, the addition of a yellow phosphor provided the advantage on high brightness, while the green and orange phosphors work advantageously to increase the CRI. In other words, optimization of the CRI value and the brightness may be achieved separately by fine tuning the ratio of the yellow phosphor concentration to that of the orange and green phosphors.

Figure 3:
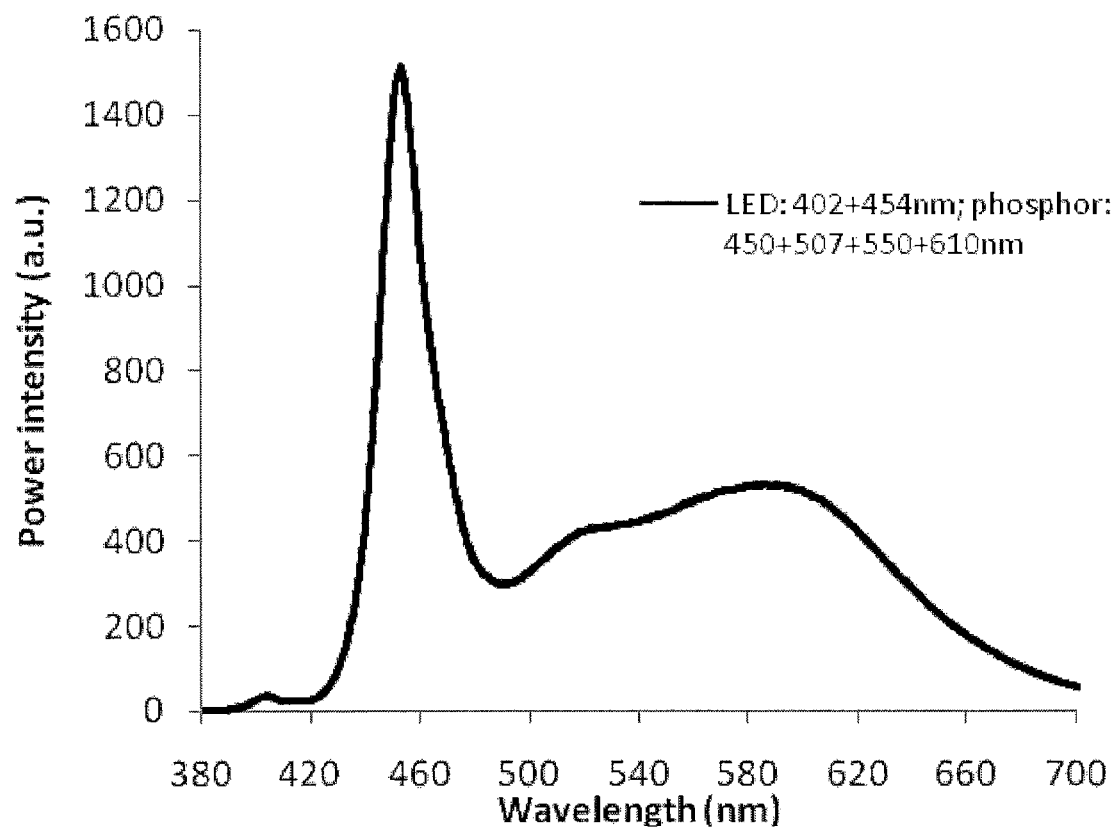
FIG. 3 is a plot of emission intensity versus wavelength for a two-LED radiation source providing excitation radiation to a four-phosphor system, the LEDs emitting at 402 and 454 nm, and the phosphors having peak emission intensities at 450, 507, 550, and 610 nm, respectively.

In the third example, a blue phosphor designated B450 was added to the green, yellow, and orange mix (G507, Y550, O610, respectively) discussed in the second example. FIG. 3 shows the emission spectrum from a white LED utilizing the same UV and blue LED chip sources as in the first and second examples (402 nm and 454 nm). The brightness was 23.62, the CRI 89.1. The blue phosphor effectively absorbs the UV light from this multi-chip excitation source, while being substantially transparent to the blue light from the blue LED, allowing it to co-excite the yellow, green, and orange phosphors in the system. It should be noted that the blue phosphor used in this particular test demonstrated less than 50% quantum efficiency at the 402 nm excitation wavelength, and it is contemplated that a greater than 30% increase in brightness may be achieved with blue phosphors that have a 70% quantum efficiency.

In the fourth and fifth examples of the present embodiments, a different chip set was used. Here, the two chips provided co-excitation radiation at wavelengths centered at 429 and 457 nm, respectively. These are examples of a two-chip co-excitation source where the first radiation source emits light in a wavelength ranging from 410 to 440 nm, and where the second radiation source emits light at wavelengths ranging from 440 to 480. So whereas the chip set in the first three examples might be described as a UV and blue combination, the chip set in the fourth and fifth examples are a purple (could also be described as violet) LED and blue LED set. The purple LED emits at 429 nm, which is just at the shortest end of the spectrum where the human eye is able to detect illumination. The other LED is a blue LED which emits at 457 nm, substantially the same as that used in the conventional white LED (blue LED/YAG:Ce). The blue and purple multi-chip set was used to provide co-excitation radiation to two different phosphor packages, as described below.

In the fourth example the phosphor package contained two phosphors, one green and one orange (G507, and O610, respectively). The two phosphors in this package photoluminesce at wavelengths ranging from 480 to 700 nm. The 410 to 440 nm radiation will contribute light itself to final white light illumination product, and thus determine at least in part the color and brightness of the white light, in contrast to the chip set containing the UV LED. On the other hand, it demonstrates a greater efficiency in exciting yellow and green phosphors, so the major advantage of such a combination is to allow the use of shorter emission wavelength phosphors in order to achieve high CRI value while maintaining brightness.

Figure 4:
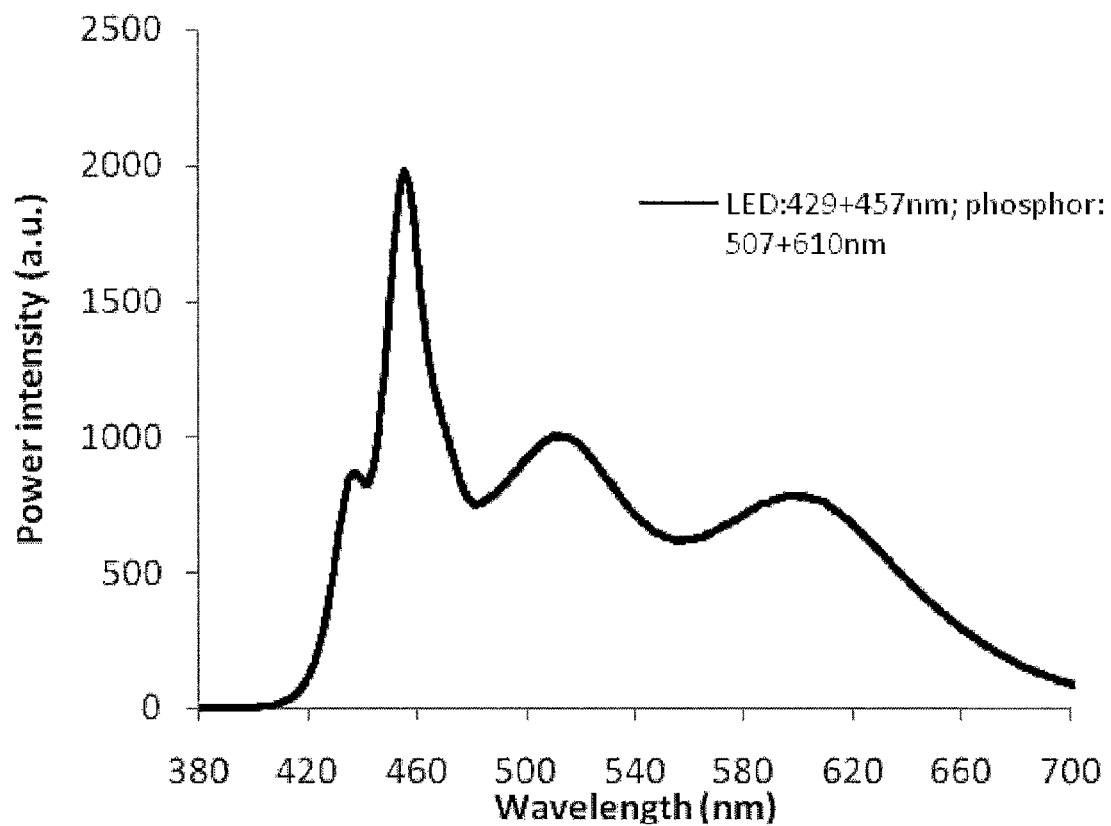
FIG. 4 is a plot of emission intensity versus wavelength for a two-LED radiation source providing excitation radiation to a three-phosphor system, the LEDs emitting at 402 and 454 nm, and the phosphors having peak emission intensities at 507 and 610 nm, respectively.

A spectrum of the white light illumination from this system is shown in FIG. 4. The brightness of the illumination was 38.37, and the CRI was 92.0.

Figure 5:
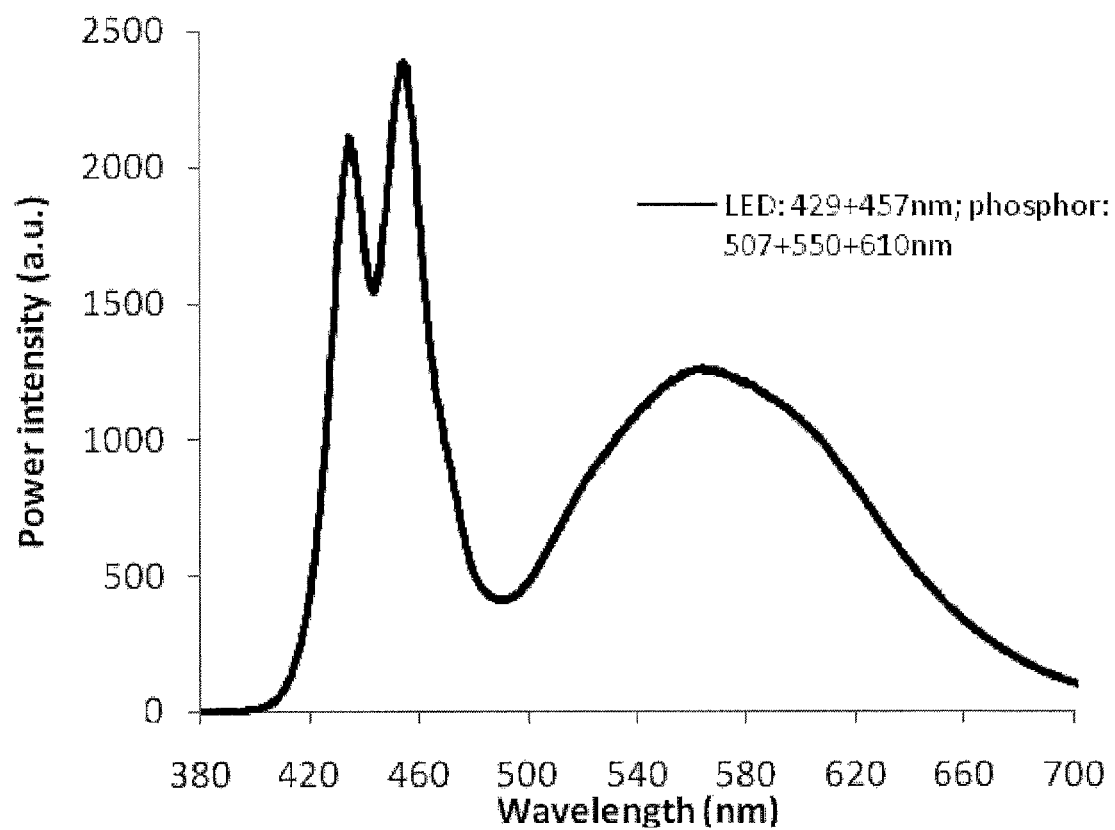
FIG. 5 is a plot of emission intensity versus wavelength for a two-LED radiation source providing excitation radiation to a three-phosphor system, the LEDs emitting at 429 and 457 nm, and the phosphors having peak emission intensities at 507, 550, and 610 nm, respectively.

In the fifth example a yellow phosphor designated Y550 was added to the green and orange mix (G507 and O610, respectively) discussed previously in the fourth example. FIG. 5 shows the emission spectrum from a white LED utilizing the same purple and blue LED chip radiation sources from the first example (429 nm and 457 nm, respectively, representing radiation sources of 410 to 440 nm, and 440 to 480 nm sources, respectively). This time the purple/blue LEDs co-exciting a yellow, green, and orange phosphor package produced white light illumination with more than a 30% increase in brightness. As in the transition from the second to third examples, this increase in brightness from the fourth to fifth examples was achieved via the addition of the yellow phosphor, as substantially all the other variables of the experiments were held constant, and optimization of the CRI value and the brightness may be achieved separately by fine tuning the ratio of the yellow phosphor concentration to that of the orange and green phosphors. The white light produced in this second example may be characterized as having a brightness of 52.0, and a CRI of 79.9.

The multi-chip excitation source in the first five examples was either a UV/blue combination or a purple/blue combination. High brightness, high CRI white light illumination sources can be provided by using a blue chip and green chip with a phosphor package having two phosphors in one embodiment, and three phosphors in another. These phosphors can be any combination of a green phosphor such as G530, a yellow phosphor such as Y550), an orange phosphor such as O590, and a red phosphor such as R662. In this sixth example, the chip set was a blue LED in combination with a green LED. So in example three the white LED comprised a first radiation source emitting light in wavelength ranging from 440 to 480 nm, and a second radiation source co-exciting a phosphor package, the second radiation source emitting light in wavelengths ranging from 480 to 540 nm. This chip set provided co-excitation radiation to at least two types of phosphors emitting light in wavelength range from 500 to 700 nm. More specifically, the mixed phosphors in the system exemplified by the sixth embodiment contained a green and orange phosphor (G530 and O590), where an orange or red phosphor is included because of the 480 to 540 nm emitting blue-green LED. Some orange and red phosphors, such as silicate-based phosphors, have a higher quantum efficiency as the excitation wavelength increases from 440 to 550 nm, so the use of green excitation radiation increases the efficiency of an orange and/or red phosphor so as to achieve higher brightness. The further addition of other green and/or yellow phosphor can broaden the final LED emission wavelength spectrum, thus increase the CRI value.

Figure 6:
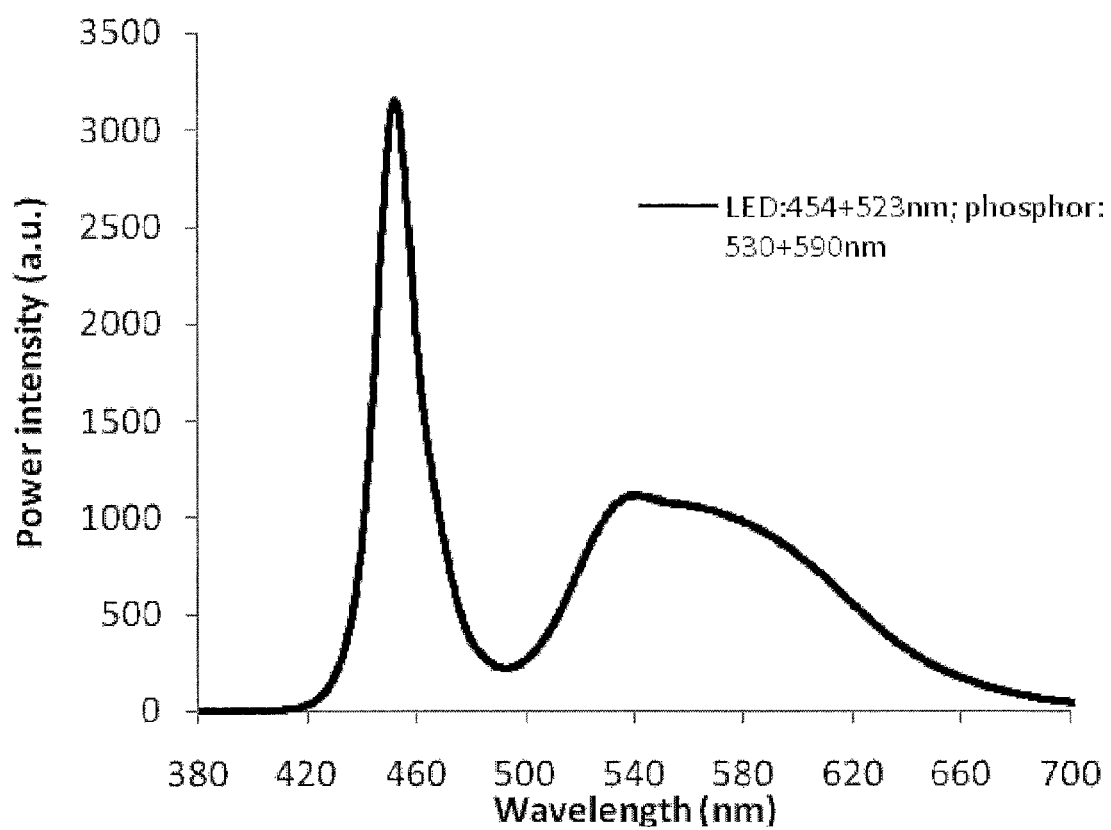
FIG. 6 is a plot of emission intensity versus wavelength for a two-LED radiation source providing excitation radiation to a two-phosphor system, the LEDs emitting at 454 and 523 nm, and the phosphors having peak emission intensities at 530 and 590 nm, respectively.

FIG. 6 shows a white LED made from a chip set comprising a 454 nm LED and a 523 nm LED, this chip set providing co-excitation radiation to a phosphor package comprising a 530 nm green phosphor and a 590 nm orange phosphor. The brightness was 43.92, and the CRI value 71.9; again, the brightness and/or CRI values may be optimized by using different phosphors, and by tuning the respective intensities of the green versus blue LEDs.

Table 1 summarizes the testing results of the white light illumination systems of FIGS. 1-6, where the CIE coordinates have been substantially fixed at x and y values of 0.3 and 0.3 respectively, and where the white light is characterized by brightness and CRI values.

TABLE 1

| Phosphor | LED | CIE x | CIE y | Brightness (a.u.) | CRI |
|---|---|---|---|---|---|
| G507 + O610 | 402 nm + 454 nm | 0.286 | 0.304 | 31.32 | 91.8 |
| G507 + Y550 + O610 | 402 nm + 454 nm | 0.303 | 0.300 | 40.64 | 80.7 |
| B450 + G507 + Y550 + O610 | 402 nm + 454 nm | 0.307 | 0.294 | 23.62 | 89.1 |
| G507 + O610 | 429 nm + 457 nm | 0.302 | 0.302 | 38.37 | 92.0 |
| G507 + Y550 + O610 | 429 nm + 457 nm | 0.309 | 0.293 | 52.07 | 79.9 |
| G530 + O590 | 454 nm + 523 nm | 0.295 | 0.301 | 43.92 | 71.9 |

For comparison to these multi-chip systems, a similar set of experiments was carried out with a single-chip excitation source. The LEDs in these single-chip examples emitted excitation radiation in a wavelength ranging from 250 nm to 440 nm; they were in the seventh through tenth examples: 402, 402, 417, and 429 nm, respectively. The phosphor packages were different combinations of blue, green and orange phosphors. Specifically they were blue, green, and orange in the seventh example; blue, green, yellow, and orange in the eighth example; green, yellow, and orange in the ninth example, and green and orange in the tenth example.

Figure 7:
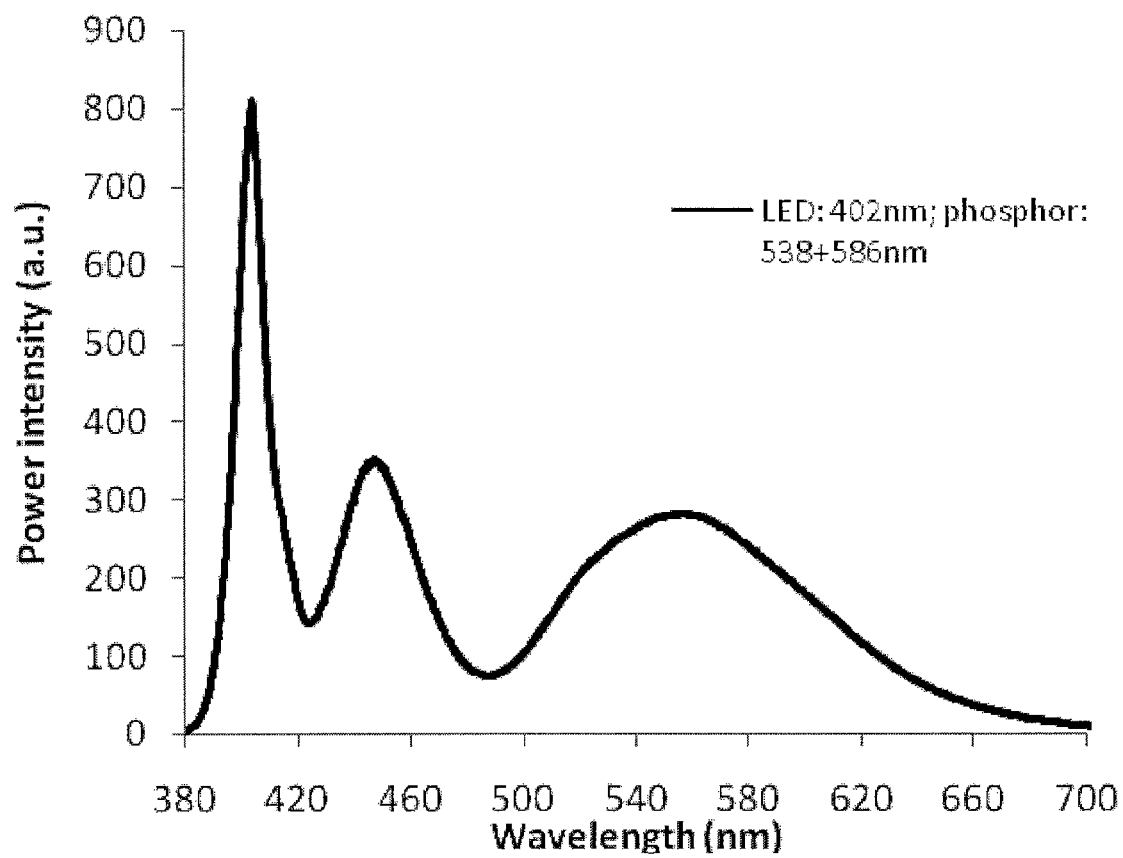
FIG. 7 is a plot of emission intensity versus wavelength for a single LED radiation source providing excitation radiation to a two-phosphor system, the LED emitting at 402 nm, and the phosphors having peak emission intensities at 538 and 586 nm, respectively.

FIG. 7 shows the emission spectrum from a white LED made constructed using from a 402 nm LED, a 450 nm blue phosphor, a 538 nm blue-green phosphor, and a 586 nm orange phosphor. The blue phosphor used in had less than a 50% quantum efficiency at the 402 nm excitation wavelength, and more than a 30% increase in brightness could be achieved with a blue phosphor having a 70% quantum efficiency. The brightness was 10.63; the CRI 64.7.

Figure 8:
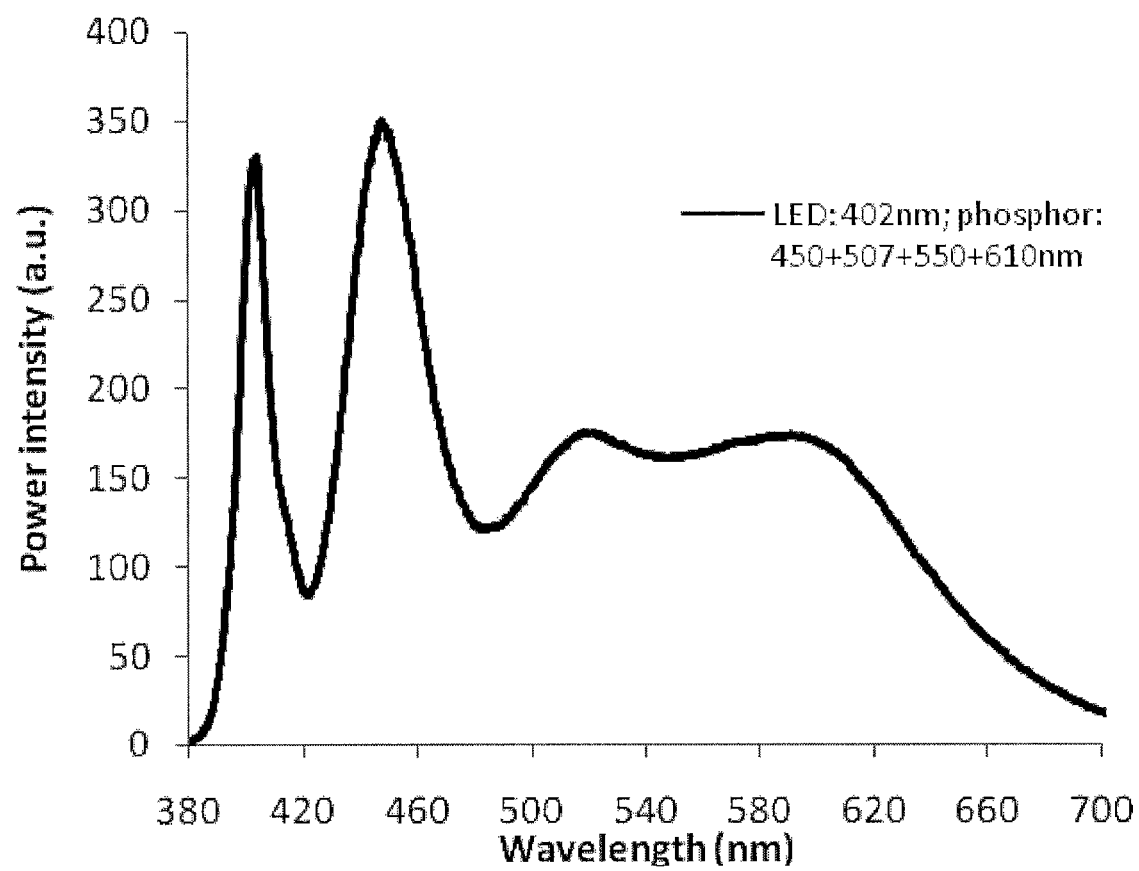
FIG. 8 is a plot of emission intensity versus wavelength for a single LED radiation source providing excitation radiation to a four-phosphor system, the LED emitting at 402 nm, and the phosphors having peak emission intensities at 450, 507, 550, and 610 nm, respectively.

FIG. 8 shows the emission spectrum from a white LED constructed from a 402 nm LED, a 450 nm blue phosphor, a 507 nm blue-green phosphor, a 550 nm yellow phosphor, and a 610 nm orange phosphor. The brightness was 8.29 and the CRI was 91.7.

Figure 9:
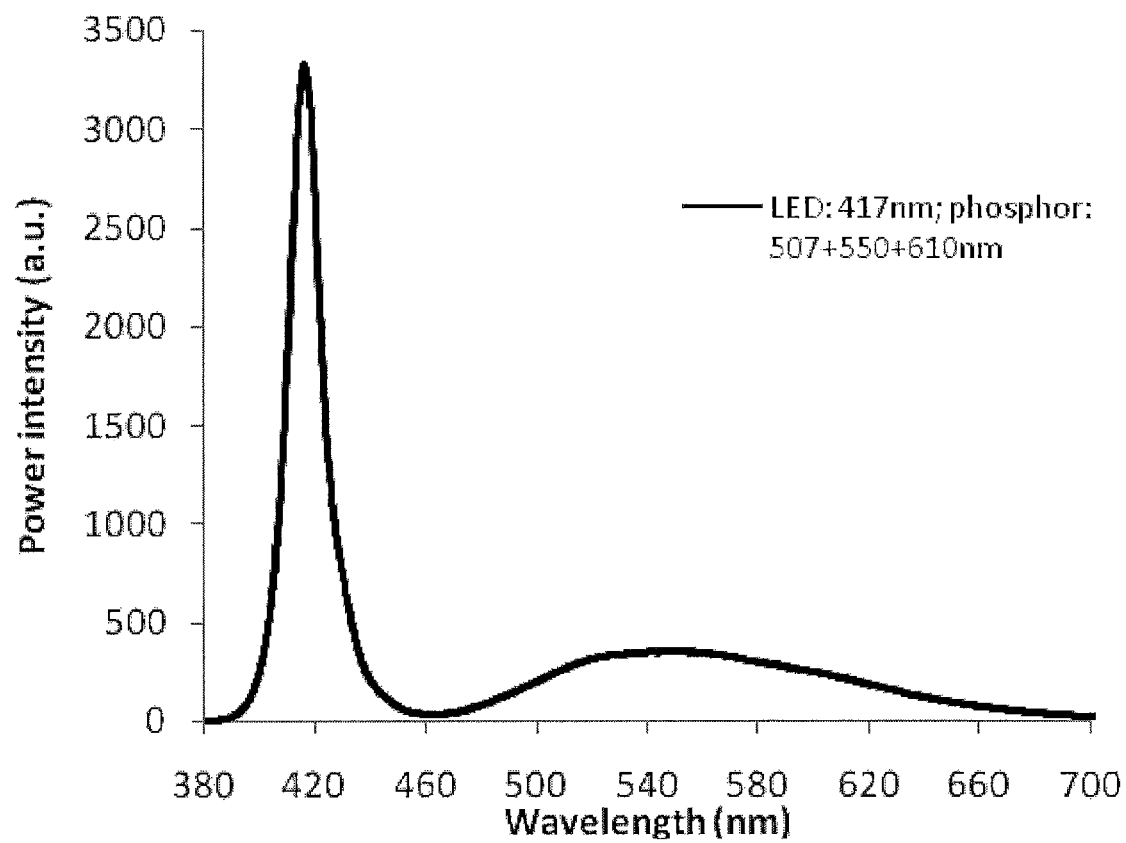
FIG. 9 is a plot of emission intensity versus wavelength for a single LED radiation source providing excitation radiation to a three-phosphor system, the LED emitting at 402 nm, and the phosphors having peak emission intensities at 507, 550, and 610 nm, respectively.

FIG. 9 shows the emission spectrum from a white LED made constructed from a 417 nm LED, a 507 nm blue-green phosphor, a 550 nm yellow phosphor and a 610 nm orange phosphor. The brightness was 14.53 and the CRI was 62.8.

Figure 10:
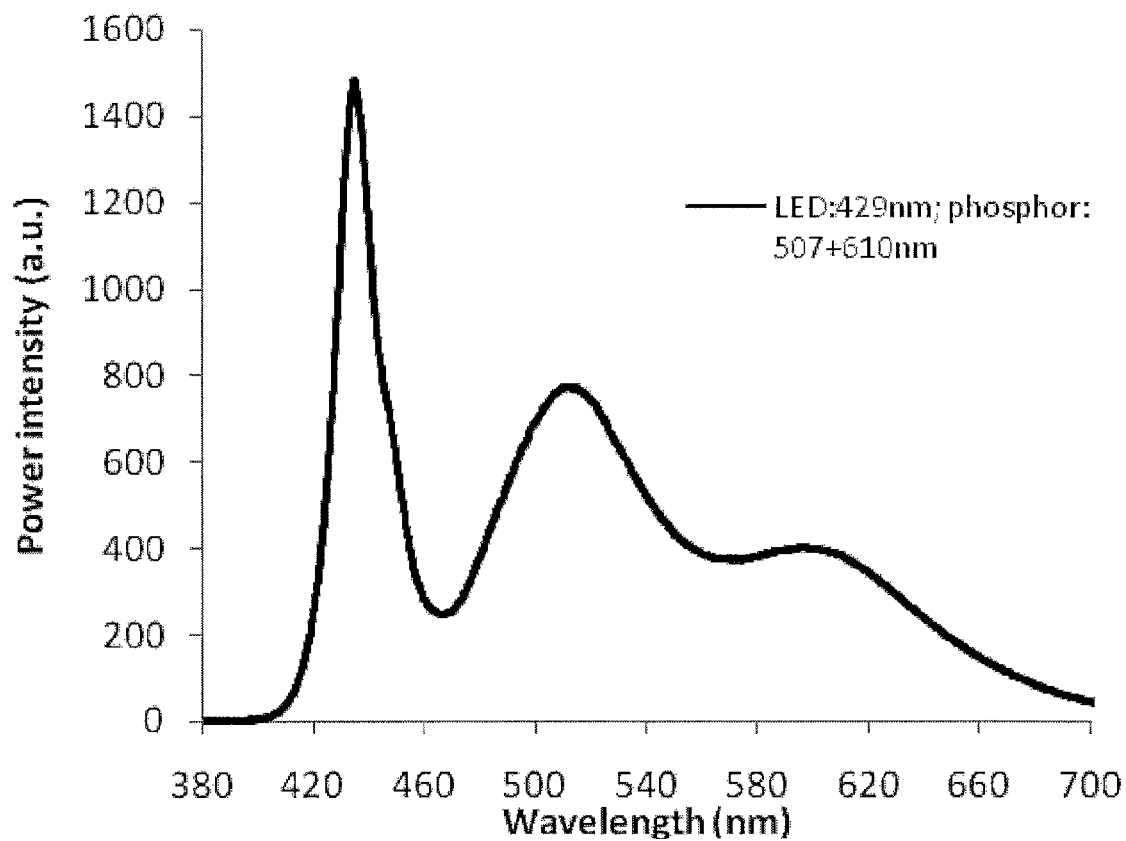
FIG. 10 is a plot of emission intensity versus wavelength for a single LED radiation source providing excitation radiation to a two-phosphor system, the LED emitting at 429 nm, and the phosphors having peak emission intensities at 507 and 610 nm, respectively.

FIG. 10 shows the emission spectrum from a white LED made constructed from a 429 nm LED, a 507 nm blue-green phosphor, and a 610 nm orange phosphor. The brightness was 23.98, and the CRI was 86.8.

Table 2 summarizes the testing results of the white light illumination systems of FIGS. 7-10, where the CIE coordinates have been substantially fixed at x and y values of 0.3 and 0.3 respectively, and where the white light is characterized by brightness and CRI values.

TABLE 2

| Phosphor | LED | CIE x | CIE y | Brightness (a.u.) | CRI |
|---|---|---|---|---|---|
| B450 + G538 + O586 | 402 nm | 0.304 | 0.335 | 10.63 | 64.7 |
| B450 + G507 + Y550 + O610 | 402 nm | 0.301 | 0.298 | 8.29 | 91.7 |
| G507 + Y550 + O610 | 417 nm | 0.296 | 0.301 | 14.53 | 62.8 |
| G507 + O610 | 429 nm | 0.275 | 0.312 | 23.98 | 86.8 |

In yet another embodiment of the present invention, a white LED comprises a first radiation source emitting excitation radiation in a wavelength ranging from about 250 nm to about 440 nm, a second radiation source emitting excitation radiation in a wavelength ranging from about 440 nm to about 480 nm, and a phosphor package comprising an yellow-orange phosphor having a peak emission wavelength ranging from about 540 to 600 nm, and/or a red phosphor having a peak emission wavelength ranging from about 580 to about 780 nm.

Exemplary Phosphor Compositions

The advantages of the present multi-chip excitation sources are not restricted to any particular type of phosphor. Indeed, it is contemplated that virtually any of the commercial blue, green, yellow, orange, and red phosphors listed in Section 8 and Appendix II of Inorganic Phosphors, by William M. Yen and Marvin J. Weber (CRC Press, New York, 2004). Section 8 and Appendix II of this reference is therefore incorporated herein by reference in their entirety.

Examples of the blue, blue-green, yellow, yellow-orange, orange, and red phosphors that are suitable to carry out the teachings of the present embodiments include the aluminates, silicates, and nitrides (and mixtures thereof) that have been developed by the present inventors. Although the present embodiments are not restricted to the following definitions, it is true that for the examples in the disclosure the blue phosphors tended to be aluminate-based; the green phosphors could be either aluminates or silicates, the yellow and orange phosphors tended to be silicate-based, albeit with different types of host structures; and the red phosphors are nitrides.

An exemplary blue aluminate-based phosphor has the general formula $(M_{1-x}Eu_x)_{2-z}Mg_zAl_yO_{[2+(3/2)y]}$, where M is a divalent alkaline earth metal other than magnesium (Mg) from group IIA of the periodic table, where $0.05 < x < 0.5$; $3 \leq y \leq 12$; and $0.8 \leq y \leq 1.2$. The composition may contain a halogen dopant, such as fluorine or chlorine. M may be either Ba (barium) or Sr (strontium); when M is Ba, the phosphor is a member of the present barium aluminate magnesium (BAM) series; when M is strontium, the phosphor is a member of the present strontium magnesium aluminate (SAM) series. The halogen dopant may reside on oxygen lattice sites within the crystalline lattice host, and is present in an amount ranging from about 0.01 to 20 mole percent. The phosphor in this example is configured to absorb radiation in a wavelength ranging from about 280 nm to about 420 nm, and to emit visible light having a wavelength ranging from about 420 nm to 560 nm.

An exemplary phospho-chloride that may be used as the blue phosphor in the present embodiments, and the phosphor B450 that was used to generate the data in FIGS. 3, 7, and 8 has the formula $Sr_5Cl(PO_4)_3$:Eu, specifically $Sr_{10}(PO_4)_6Cl_2Eu_{0.05}$.

It is reiterated that the types of phosphors or the specific phosphors are not the key to the embodiments of the present invention; rather, it is that the at least two LEDs in the system are there substantially to provide excitation radiation to the at least one phosphor in the phosphor package, and not to provide light to the final illumination product. Thus it is contemplated that virtually any phosphor(s) will work, and this includes commercially available phosphors. Commercially available blue phosphors that may be used according to the present embodiments include $(CeMg)SrAl_{11}O_{18}$:Ce, $(CeMg)BaAl_{11}O_{18}$:Ce, $YAlO_3$:$Ce^{3+}$, $Ca_2MgSi_2O_7$:$Ce^{3+}$, $Y_2SiO_5$:$Ce^{3+}$, $Zn_2SiO_4$:Ti, CsI:$Na^+$, $Sr_2P_2O_7$:Eu, $Sr_5Cl(PO_4)_3$:Eu, $BaMgAl_{10}O_{17}$:Eu,Mn (BAM), and ZnS:Ag,Cl,Ni. These phosphors emit at wavelengths up to about 460 nm.

The green phosphors may be either aluminate or silicate-based, or a combination of both. The aluminate-based green phosphors may be represented by the general formula $M_{1-x}Eu_xAl_yO_{[1+3y/2]}$, where M is at least one of a divalent metal selected from the group consisting of Ba, Sr, Ca, Mg, Mn, Zu, Cu, Cd, Sm, and Tm; $0.1<x<0.9$; and $0.5 \leq y \leq 12$. These aluminate-based green phosphors are configured to absorb substantially non-visible radiation having a wavelength ranging from about 280 to 420 nm, and emit visible green light having a wavelength ranging from about 500 to 550 nm. In a particular embodiment, the phosphor contains the divalent alkaline earth metals Mg, and Mn may be present as well.

The silicate-based green phosphors appropriate for the present white LEDs using multi-chip co-excitation sources have the general formula $(Sr,A_1)_x(Si,A_2)(O,A_3)_{2+x}$:$Eu^{2+}$, where $A_1$ is at least one of a divalent 2+ alkaline earth or transition metal cation selected from the group consisting of Mg, Ca, Ba, and Zn, wherein the stoichiometric amount of $A_1$ varies from 0.3 to 0.8, both inclusive; $A_2$ is P, B, Al, Ga, C, and Ge; and $A_3$ is a anion including a halogen selected from the group consisting of F and Cl, but also included are Br, C, N, and S. The formula is written to indicate that the $A_1$ cation replaces Sr; the $A_2$ cation replaces Si, and the $A_3$ anion replaces O. The amounts of $A_2$ and $A_3$ each range from 0 to 19 mole percent, both endpoints inclusive; and x is any value between 1.5 and 2.5. $A_1$ could also include a combination of 1+ and 3+ cations, the 1+ cations including Na, K, and Li, and the 3+ cations including Y, Ce, and La.

Exemplary silicates that may be used as the green phosphors in the present embodiments and designated G507 in FIGS. 1-5 and 8-10 has the formula $Ba_{1.96}Mg_{0.04}Eu_{0.06}Si_{1.03}O_4Cl_{0.12}$. The phosphor designated G530 in FIG. 6 has the formula $Sr_{1.03}Ba_{0.92}Mg_{0.05}Eu_{0.06}Si_{1.03}O_4Cl_{0.12}$. The phosphor designated G538 in FIG. 7 has the formula $Sr_{1.15}Ba_{0.80}Mg_{0.05}Eu_{0.06}Si_{1.03}O_4Cl_{0.12}$. Another formula for an appropriate silicate-based green phosphor (not shown in the figures) is G525: $Sr_{0.925}Ba_{1.025}Mg_{0.05}Eu_{0.06}Si_{1.03}O_4Cl_{0.12}$.

Commercially available green phosphors that may be used according to the present embodiments include $Bi_4Ge_3O_{12}$, $Ca_5(PO_4)_3F$:Sb, $(Ba,Ti)_2P_2O_7$:Ti, $Sr_5(PO_4)_3F$:Sb,Mn, ZnO:Zn, ZnS:Cu,Cl, $Zn_2SiO_4$:$Mn^{2+}$, and $Y_3Al_5O_{12}$:$Ce^{3+}$. These phosphors emit at wavelengths roughly between about 480 and 530 nm, and the designation of this range as being "green," as opposed to "blue-green" or "yellow-green" is arbitrary and not particularly important.

An exemplary silicate-based yellow-green phosphor has the general formula $A_2SiO_4$:$Eu^{2+}$D, wherein A is at least one of a divalent metal selected from the group consisting of Sr, Ca, Ba, Mg, Zn, and Cd; and D is a dopant selected from the group consisting of F, Cl, Br, I, P, S and N. The dopant D is present in the phosphor in an amount ranging from zero to about 20 mole percent. In another embodiment, the phosphor has the formula $(Sr_{1-x-y}Ba_xM_y)_2SiO_4$:$Eu^{2+}$F, Cl, where M is one of Ca, Mg, Zn, or Cd in an amount ranging from $0<y<0.5$.

An exemplary silicate that may be used as the yellow phosphor in the present embodiments, and the phosphor Y550 that was used to generate the data in FIGS. 2, 3, 5, 8, and 9 has the formula $Sr_{1.34}Ba_{0.61}Mg_{0.05}Eu_{0.06}Si_{1.03}O_4Cl_{0.12}$. A YAG:$Ce^{3+}$ phosphor may also be used to provide the yellow component. Another silicate-based phosphor (not shown in the figures) has the designation EY4453 and formula $Sr_{1.46}Ba_{0.45}Mg_{0.05}Eu_{0.1}Si_{1.03}O_4Cl_{0.18}$.

Commercially available yellow phosphors that may be used according to the present embodiments include ZnS:Pb, Cu, ZnS:Ag,Cu,Cl, $Y_3Al_5O_{12}$:$Tb^{3+}$, $(Ce,Tb)MgAl_{11}O_{19}$:Ce, Tb, $Y_3Al_5O_{12}$:$Ce^{3+}$, $MgF_2$:$Mn^{2+}$, CsI:Tl, and $(Zn,Mg)F_2$:$Mn^{2+}$. These phosphors emit at wavelengths roughly between about 530 and 590 nm, and the designation of this range as being "yellow," as opposed to "yellow-green" or "yellow-orange" is arbitrary and not particularly important.

Silicate-based orange phosphors appropriate for the present multi-chip white LEDs have the general formula $(Sr,A_1)_x(Si,A_2)(O,A_3)_{2+x}$:$Eu^{2+}$, where $A_1$ is at least one divalent cation (a 2+ ion) including Mg, Ca, and Ba, or a combination of 1+ and 3+ cations, where 1+ cations include Na, K, and Li, and the 3+ cations include Y, Ce, and La; $A_2$ is a 3+, 4+, or 5+ cation, including at least one of B, Al, Ga, C, Ge, P; $A_3$ is a 1-, 2-, or 3- anion, including F, Cl, and Br as 1- anions; and x is any value between 2.5 and 3.5, inclusive. Again, the formula is written to indicate that the $A_1$ cation replaces Sr; the $A_2$ cation replaces Si, and the $A_3$ anion replaces O. $A_1$ varies stoichiometrically from 0.3 to 0.8, both inclusive, and the amounts of $A_2$ and $A_3$ each range from 0 to 19 mole percent, both endpoints inclusive. In another embodiment, the silicate-based orange phosphors have the formula $(Sr_{1-x}M_x)_yEu_zSiO_5$, wherein M is at least one of a divalent metal selected from the group consisting of Ba, Mg, Ca, and Zn; $0 \leq x \leq 0.5$; $2.6 \leq y \leq 3.3$; and $0.001 \leq z \leq 0.5$. These phosphors too may contain halogen dopants such as F and Cl. These orange phosphors may be excited by any of the LED sources emitting in the UV, blue, green, and/or yellow regions of the spectrum.

Exemplary silicates that may be used as the orange phosphor in the present embodiments and designated O590 in FIG. 6 has the formula $Ba_{0.02}Sr_{2.94}Eu_{0.1}Si_{1.02}O_5F_{0.2}$. The orange silicate designated O610 in FIGS. 1-5 and 8-10 has the formula $(Sr_{0.87}Ba_{0.1}Y_{0.0167})_3Eu_{0.1}Si_{0.97}Al_{0.05}O_5F_{0.2}$. Another silicate-based orange phosphor that is appropriate in the present multi-chip co-excitation embodiments (not shown in the figures) has the designation O586 and the formula $Sr_3Eu_{0.06}Si_{1.02}O_5F_{0.18}$.

Commercially available orange phosphors that may be used according to the present embodiments include $(Y,Gd)BO_3$:$Eu^{3+}$, $Y(P,V)O_4$:$Eu^{3+}$, $(Zn,Mg)F_2$:$Mn^{2+}$, $(Ca,Zn,Mg)_3(PO_4)_2$:Sn, $CaSiO_3$:$Mn^{2+}$,Pb, $Y_2O_3$:$Eu^{3+}$, and $YVO_4$:$Eu^{3+}$. These phosphors emit at wavelengths roughly between about 590 and 620 nm, and the designation of this range as being "orange," as opposed to "yellow-orange" or "orange-red" is arbitrary and not particularly important.

Red phosphors that may be used according to the present embodiments typically have nitride-based hosts. A general formula that may be used to describe such nitride-based red phosphor is $M_mM_aM_b(N,D)_n:Z_z$, where $M_m$ is a divalent element; $M_a$ is a trivalent element; $M_b$ is a tetravalent element; N is nitrogen; Z is an activator; and D is a halogen; and and where the stoichiometry of the constituent elements (m+z):a:b:n is about 1:1:1:3, and the phosphor is configured to emit visible light having a peak emission wavelength greater than about 640 nm. Another formula that may be used to describe the present nitride-based red phosphor is $M_mM_aM_bD_{3w}N_{[(2/3)m+z+a+(4/3)b-w]}Z_z$, where $M_m$ is a divalent element selected from the group consisting of Be, Mg, Ca, Sr, Ba, Zn, Cd, and Hg; $M_a$ is a trivalent element selected from the group consisting of B, Al, Ga, In, Y, Sc, P, As, La, Sm, Sb, and Bi; $M_b$ is a tetravalent element selected from the group consisting of C, Si, Ge, Sn, Ni, Hf, Mo, W, Cr, Pb, Ti, and Zr; D is a halogen selected from the group consisting of F, Cl, Br, and I; Z is an activator selected from the group consisting of Eu, Ce, Mn, Tb, and Sm; N is nitrogen. The amounts of the constituent elements may be described by the following parameters: $0.01 \leq m \leq 1.5$; $0.01 \leq a \leq 1.5$; $0.01 \leq b \leq 1.5$; $0.0001 \leq w \leq 0.6$, and $0.0001 \leq z \leq 0.5$.

In an alternative embodiment, the nitride-based red phosphors have the formula $M_aM_bM_c(N,D)_n:E_z$, where $M_a$ is not just a single divalent element, but rather a combination of two or more divalent elements (or two divalent elements used simultaneously). The two divalent metals may be, for example, Ca and Sr. Examples of such phosphors are $Ca_{0.98-x}Sr_xAlSiN_3Eu_{0.02}$, $Ca_{0.98-x}Sr_xAlSiN_3Eu_{0.02}$, $Ca_{0.98-x}Sr_xAlSiN_3Eu_{0.02}$ and $Ca_{0.98-x}Sr_xAlSiN_3Eu_{0.02}$, where x ranges from 0 to 0.98. A nitride-based red phosphor that is appropriate for use in the present multi-chip co-excitation embodiments (the red phosphor not shown in the figures) has the designation R662 and the formula $Ca_{0.97}AlSiN_3Eu_{0.0}Cl_{0.1}$.

Commercially available red phosphors that may be used according to the present embodiments include $(Sr,Mg)_3(PO_4)_2$:Sn, $(Sr,Mg)_3(PO_4)_2$:Sn, $Zn_{0.4}Cd_{0.6}S$:Ag, $Zn_3(PO_4)_2$:$Mn^{2+}$, $MgSiO_3$:$Mn^{2+}$, and $Mg_4(F)(Ge,Sn)O_6$:$Mn^{2+}$. These phosphors emit at wavelengths roughly greater than about 620 nm.

LED Chips Providing Co-Excitation

The LED chips that provide the excitation radiation to the phosphor package in the present embodiments are in some cases based on indium gallium nitride, with various In to Ga ratio ($In_xGa_{1-x}N$), x varying from about 0.02 to about 0.4 for the blue emitting chips, and x greater than about 0.4 for the green emitting chips. The value of x separating the blue emitting chips from the green emitting chips is somewhat arbitrary; it is the actual emission wavelength that is important and not the description of its color (which may be subjective). But it will be understood that higher values of x correspond to longer wavelengths of excitation. Blue LED chips may also be based on zinc selenide (ZnSe). Green emitting LED chips may be any of the materials gallium phosphide (GaP), aluminium gallium indium phosphide (AlGaInP), and aluminium gallium phosphide (AlGaP). Green emitting chips may be mixtures of InGaN and GaN. UV to near UV emitting LED chips may be of any of the materials boron nitride (BN), aluminum nitride (AlN), aluminum gallium nitride (AlGaN) and aluminum gallium indium nitride (AlGaIN).

White Light Illumination System

Figure 11:
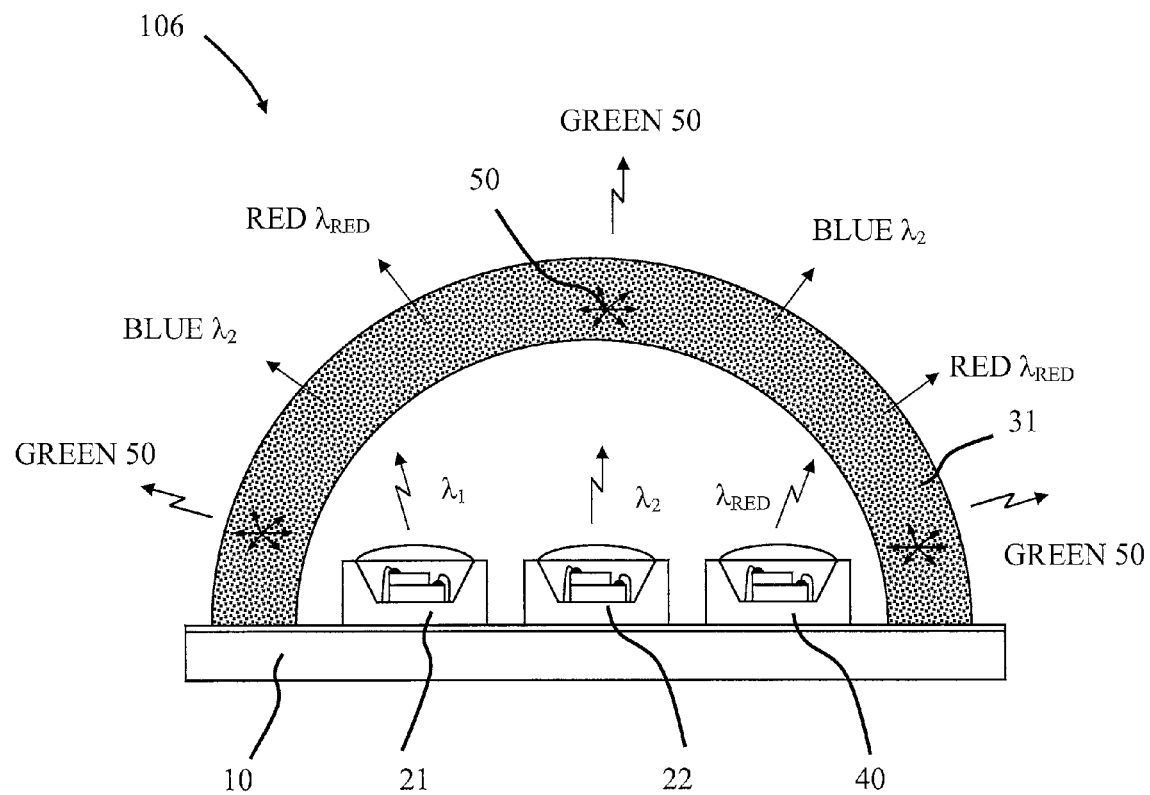
FIG. 11 is a representation of a white light illumination system according to some embodiments of the invention.
Figure 12:
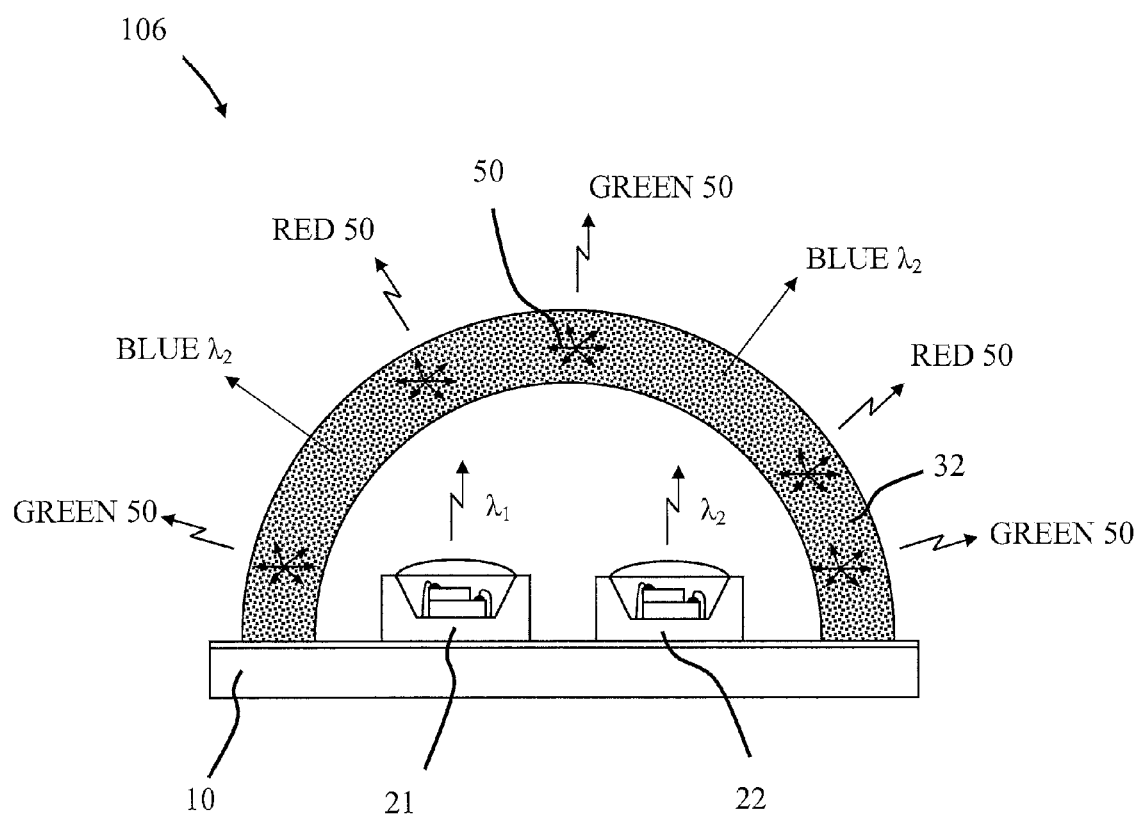
FIG. 12 is a representation of a white light illumination system according to some further embodiments of the invention.
Figure 13:
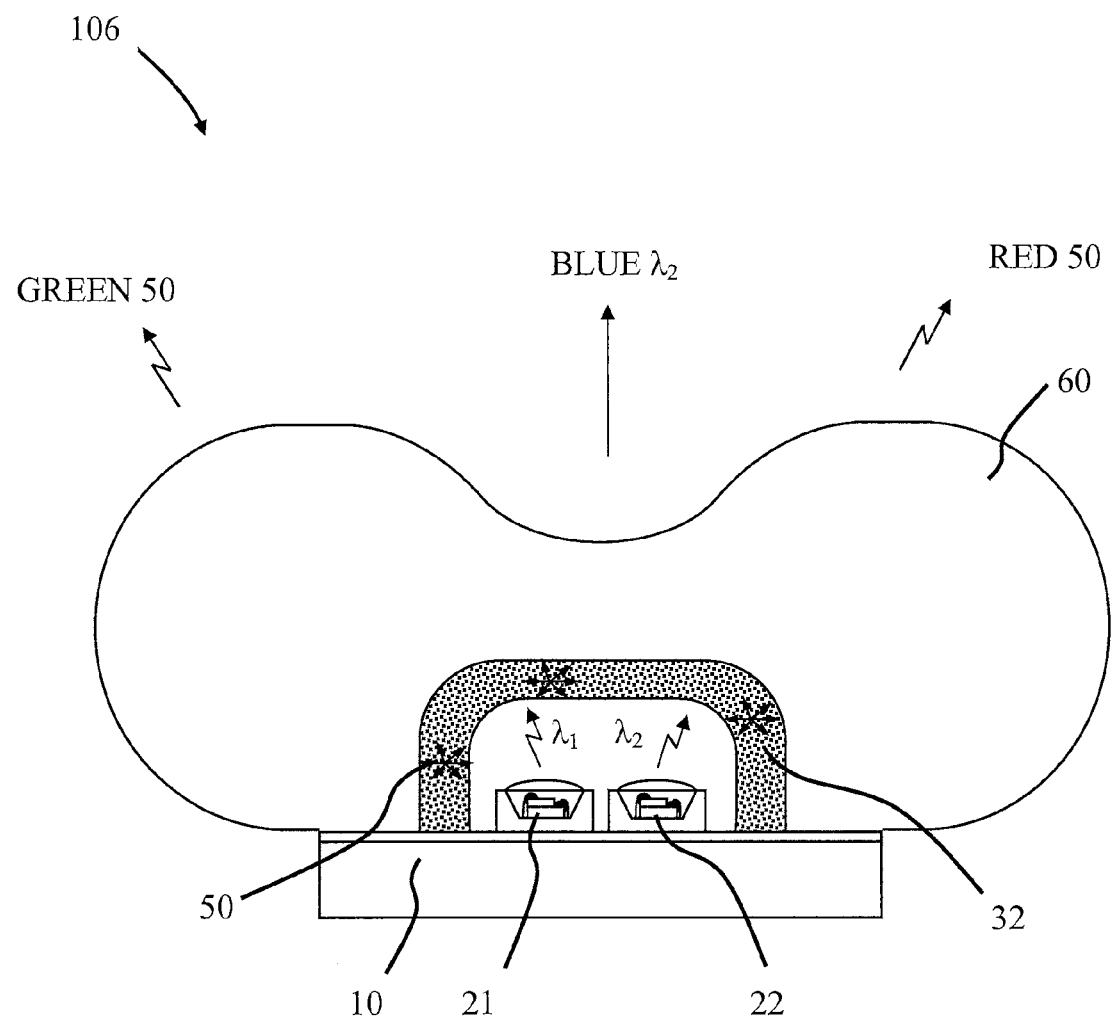
FIG. 13 is a representation of a white light illumination system embedded within a lens according to some further embodiments of the invention.

FIGS. 11 through 13 provide schematic representations of white light illumination systems 106 according to some embodiments of the invention, where the white light illumination system may comprise a phosphor package 31, 32; a first radiation source 21 for providing co-excitation radiation to the phosphor package, the source emitting in wavelengths ranging from about 250 nm to about 410 nm; a second radiation source 22 for providing co-excitation radiation to the phosphor package, the source emitting in wavelengths ranging from about 410 nm to about 540 nm; and wherein the phosphor package is configured to emit photoluminescence in wavelengths ranging from about 440 nm to about 700 nm upon co-excitation from the first and second radiation sources. The first and second radiation sources may be mounted on a substrate 10, and in embodiments the first radiation source and the second radiation source are part of a multi-chip excitation source.

Furthermore, in embodiments the first radiation source may emit in wavelengths ranging from about 390 nm to about 410 nm, and in embodiments the second radiation source may emit in wavelengths ranging from about 445 nm to about 455 nm. In some embodiments, the phosphor package may be encapsulated with the first radiation source and the second radiation source, and in other embodiments the phosphor package may be remote from the first radiation source and the second radiation source.

In some embodiments the white light illumination system may comprise a red light source 40, which as shown in FIG. 11 is incorporated within the dome-shaped (e.g. hemispherical shell) phosphor package 31; alternatively, in embodiments a red light source may be separate from a UV and blue multiple excitation light source, in which case the multiple excitation light source may provide green and blue light emission. In the example of FIG. 11, the phosphor package comprises at least a narrow band green phosphor, whereas in the examples of FIGS. 12 & 13 the phosphor package comprises at least a narrow band green phosphor and a red phosphor. In the examples of FIGS. 11-13 the phosphor generated light 50 is shown to be green for phosphor package 31, and green and red for phosphor package 32, and light from blue and red light sources 22 & 40 is shown to be transmitted through phosphor package 31 and light from blue source 22 is shown to be transmitted through phosphor package 32.

The phosphor package 31 is shown as a dome-shaped structure (e.g. hemispherical shell) over the light sources 21, 22 and 40 in FIG. 11 and phosphor package 32 is shown as a dome-shaped (e.g. hemispherical shell) structure over the light sources 21 and 22 in FIGS. 12 & 13—keeping the phosphor package separated from the light sources may assist in avoiding saturation of the photoluminescent emission from the narrow band green phosphor. FIG. 13 includes a representation of a lens 60 over the phosphor package 32 which assists in uniformly distributing the emitted light over a large solid angle—the lens 60 has a roughly toroidal shape. The phosphor package 32 may be coated over a hemispherical recess in the lens.

In embodiments, the white light illumination system may be a display backlighting system as described in further detail below.

Furthermore, in some embodiments a final light product generated by the white light illumination system may comprise photoluminescence from the phosphor package and light generated by the second radiation source, but not light generated by the first radiation source, as described herein. A first portion of the light from the second radiation source may be absorbed by the phosphor package to generate phosphor photoluminescence and a second portion of the light may be transmitted through the phosphor package and contribute to the light emitted from the white light illumination system 106.

CIE Chromaticity Characteristics of the White Light Illumination System

Figure 14:
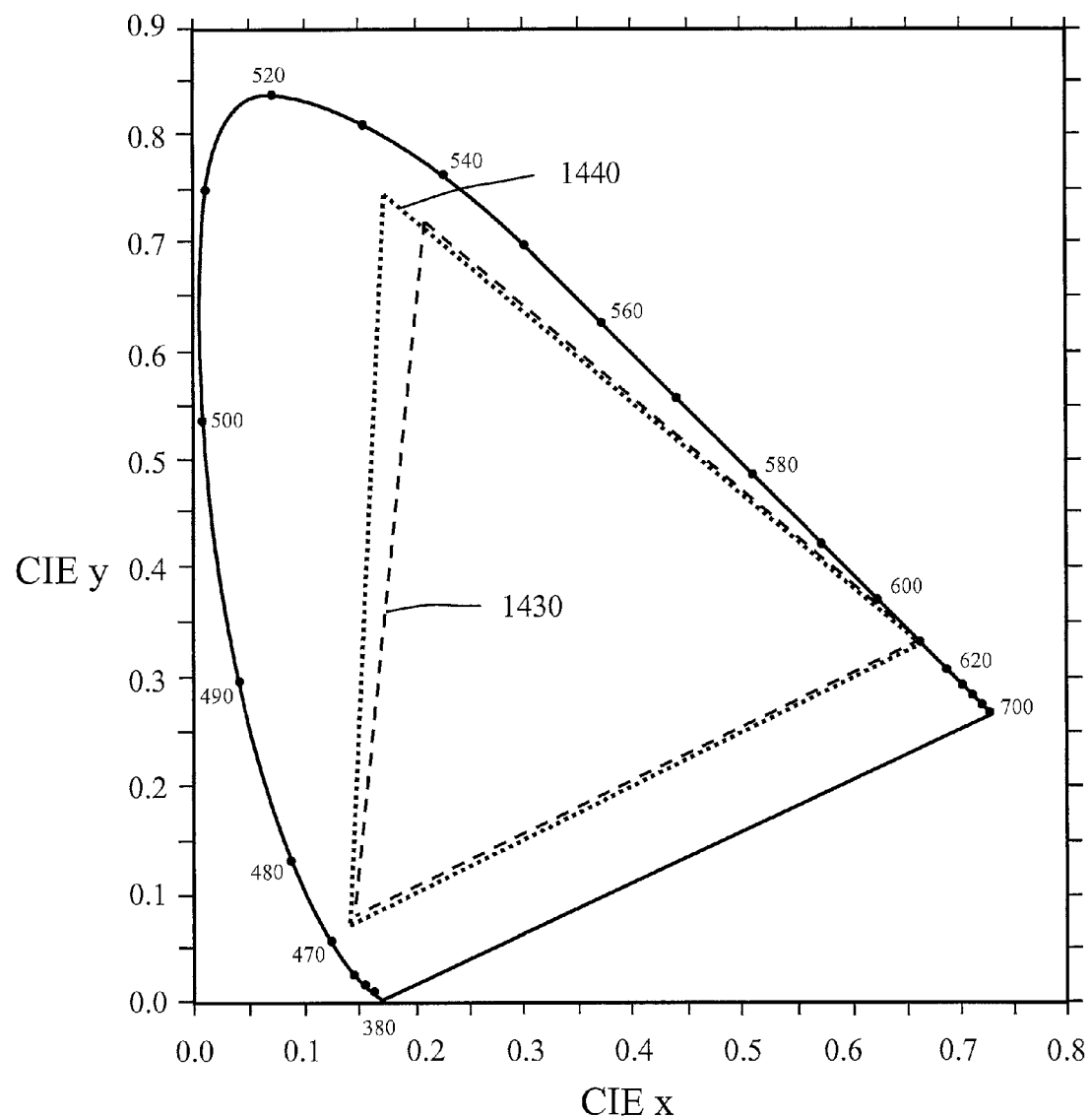
FIG. 14 is a CIE 1931 xy chromaticity diagram showing the area covered by the light emitted from an embodiment of the white light illumination source of the invention compared with the NTSC 1953 color gamut specification.
Figure 15:
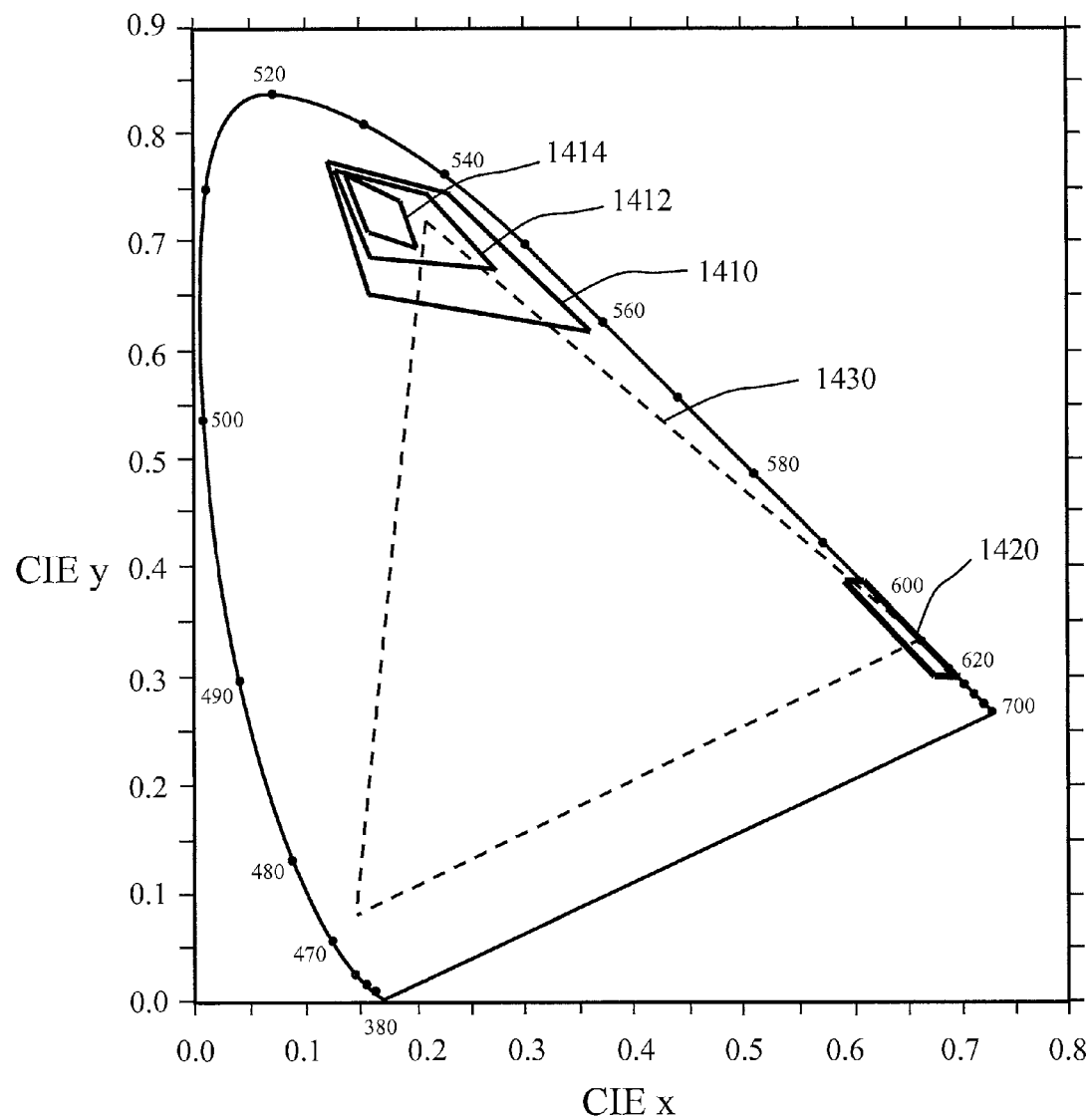
FIG. 15 is a CIE 1931 xy chromaticity diagram showing areas in which the chromaticity coordinates for green phosphors and red phosphors in the phosphor package of certain embodiments of the white light illumination system of the invention may be located.

According to aspects of the present invention, a white light illumination system may comprise: a phosphor package; a first radiation source for providing co-excitation radiation to the phosphor package, the source emitting in wavelengths ranging from about 250 nm to about 410 nm; and a second radiation source for providing co-excitation radiation to the phosphor package, the source emitting in wavelengths ranging from about 410 nm to about 540 nm; wherein the phosphor package is configured to emit photoluminescence in wavelengths ranging from about 440 nm to about 700 nm upon co-excitation from the first and second radiation sources, and wherein the phosphor package comprises a green phosphor configured to emit photoluminescence in wavelengths ranging from about 500 nm to about 550 nm and a red phosphor configured to emit photoluminescence in wavelengths ranging from about 600 nm to about 700 nm, and furthermore, where the CIE chromaticity characteristics of the white light emitted by the system is as described below with reference to FIGS. 14 and 15.

FIG. 14 is a CIE 1931 xy chromaticity diagram showing the area covered by the light emitted from an embodiment of the white light illumination source of the invention compared with the NTSC (National Television System Committee) 1953 color gamut specification. The area 1440 covered by the light emitted from an embodiment of the white light illumination source of the invention is greater than 100% of the area 1430 of the NTSC 1953 color gamut 1430. In this particular example the white light illumination system is modeled on the combination of a narrow band green phosphor with composition given by the formula $Eu_{0.4}Ba_{0.6}Mn_{0.4}Mg_{0.6}Al_{10}O_{17}$, a red phosphor with composition given by the formula Eu: $(Sr_{0.8}Ca_{0.2})SiAlN_3$ plus bromine, as described in U.S. Pat. No. 8,274,215, a 400 nm LED and a 450 nm LED. In further embodiments, the white light illumination emitted by the system covers an area including greater than 90% of NTSC 1953 color gamut specification as mapped on CIE 1931 xy chromaticity diagram. Furthermore, in embodiments the red phosphor may be a phosphor selected from the phosphors described in U.S. Pat. Appl. Pub. Nos. 2013/0168605 and 2013/0234589 and U.S. patent application Ser. No. 13/922,231, all incorporated by reference herein in their entirety.

FIG. 15 is a CIE 1931 xy chromaticity diagram showing areas in which the chromaticity coordinates for green phosphors and red phosphors in the phosphor package of certain embodiments of the white light illumination system of the invention may be located. The green phosphor is desired to have chromaticity coordinates CIE (x, y) within an area of CIE 1931 xy chromaticity diagram defined by a simple quadrilateral 1410 with vertices (0.120, 0.775), (0.230, 0.755), (0.360, 0.620) and (0.150, 0.650), in embodiments a simple quadrilateral 1412 with vertices (0.128, 0.768), (0.205, 0.753), (0.278, 0.660) and (0.150, 0.680), and in other embodiments a simple quadrilateral 1414 with vertices (0.135, 0.760), (0.180, 0.750), (0.195, 0.700) and (0.150, 0.710). The red phosphor is desired to have chromaticity coordinates CIE (x, y) within an area of CIE 1931 xy chromaticity diagram defined by a simple quadrilateral 1420 with vertices (0.61, 0.39), (0.70, 0.30), (0.68, 0.30) and (0.59, 0.39). An example of a red phosphor falling within the quadrilateral 1420 is the red phosphor with composition given by the formula Eu: $(Sr_{0.8}Ca_{0.2})SiAlN_3$ plus bromine, as described in U.S. Pat. No. 8,274,215, having CIE xy chromaticity coordinates of approximately (0.67, 0.33).

Figure 16:
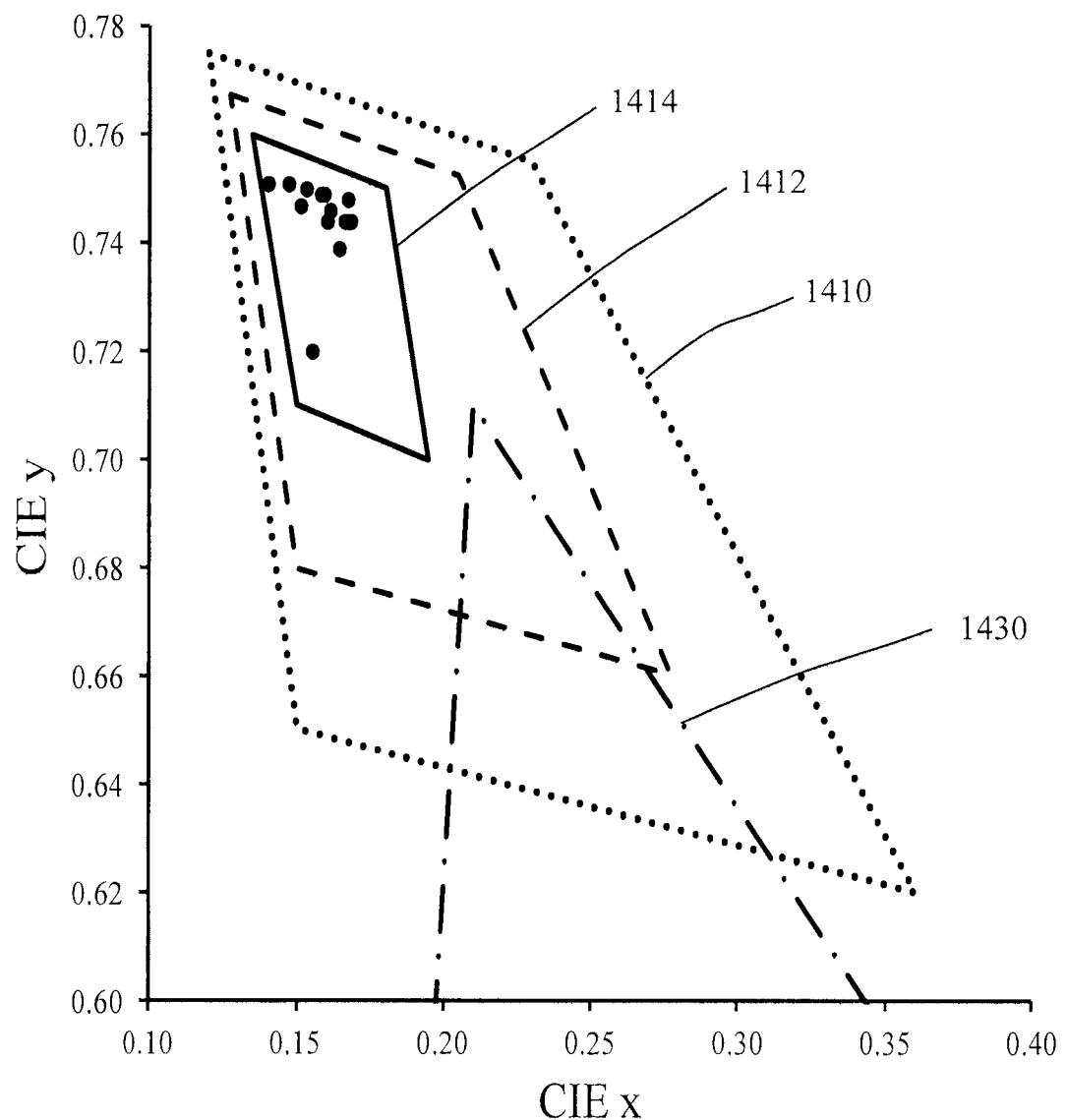
FIG. 16 is a detail of the CIE 1931 xy chromaticity diagram of FIG. 15 with CIE coordinates for various narrow band green phosphors according to embodiments of the present invention.

FIG. 16 shows a detail of FIG. 15 including the simple quadrilaterals 1410, 1412 and 1414 and the CIE coordinates of the narrow band green phosphor materials of Table 3—see below. Note that the CIE coordinates for the narrow band green phosphor materials of Table 3 fall within simple quadrilateral 1420.

Narrow Band Green Phosphor

The white light illumination system may include a green phosphor having a composition given by the formula $M_aEu_{1-a}Al_bO_c$, wherein: M is at least one divalent metal selected from the group consisting of Mg, Ca, Sr, Ba, Mn, Zn, Cu, Cd, Sm and Tm; $0 < a \leq 1.0$; $0.5 \leq b \leq 12.0$; and $1.75 \leq c \leq 19.0$. Further details of this family of phosphors, including fabrication methods, may be found in U.S. Pat. Nos. 7,541,728 and 7,755,276, incorporated by reference in their entirety herein.

Furthermore, in embodiments, the green phosphor may have a composition given by the formula $M_{1-x}Eu_xMg_{1-y}Mn_yAl_{10}O_{17}$, wherein: M is at least one alkaline earth metal; $0.01 < x \leq 1.0$; and $0.01 < y \leq 1.0$. In embodiments, M may be at least one of Ba and Sr, and in embodiments M may be Ba. In some embodiments x=1, and furthermore, y may be given by $0.1 \leq y \leq 0.7$, and in embodiments $0.2 \leq y \leq 0.4$. Examples of phosphor compositions within the latter range are given by the formulas $Eu_{1.0}Mg_{0.8}Mn_{0.2}Al_{10}O_{17}$, $Eu_{1.0}Mg_{0.7}Mn_{0.3}Al_{10}O_{17}$ and $Eu_{1.0}Mg_{0.6}Mn_{0.4}Al_{10}O_{17}$.

Figure 17:
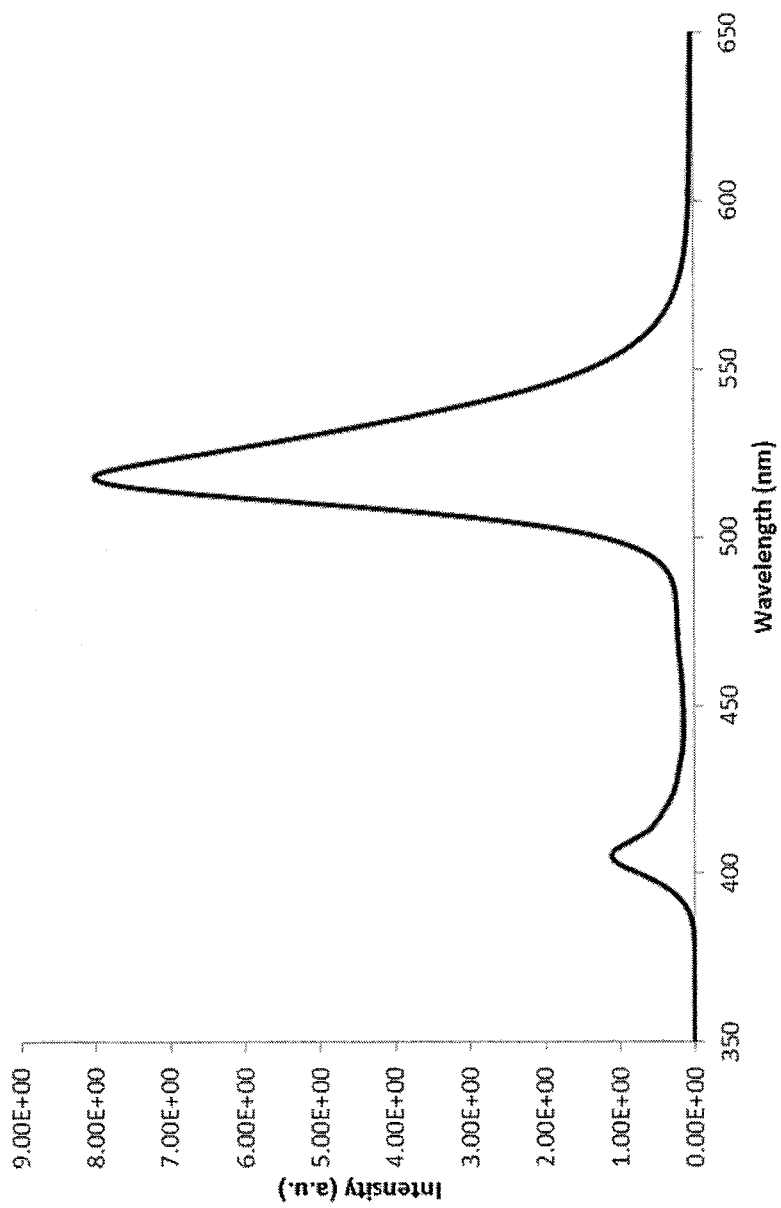
FIG. 17 is an emission spectrum of a narrow band green phosphor according to some embodiments of the invention.
Figure 18:
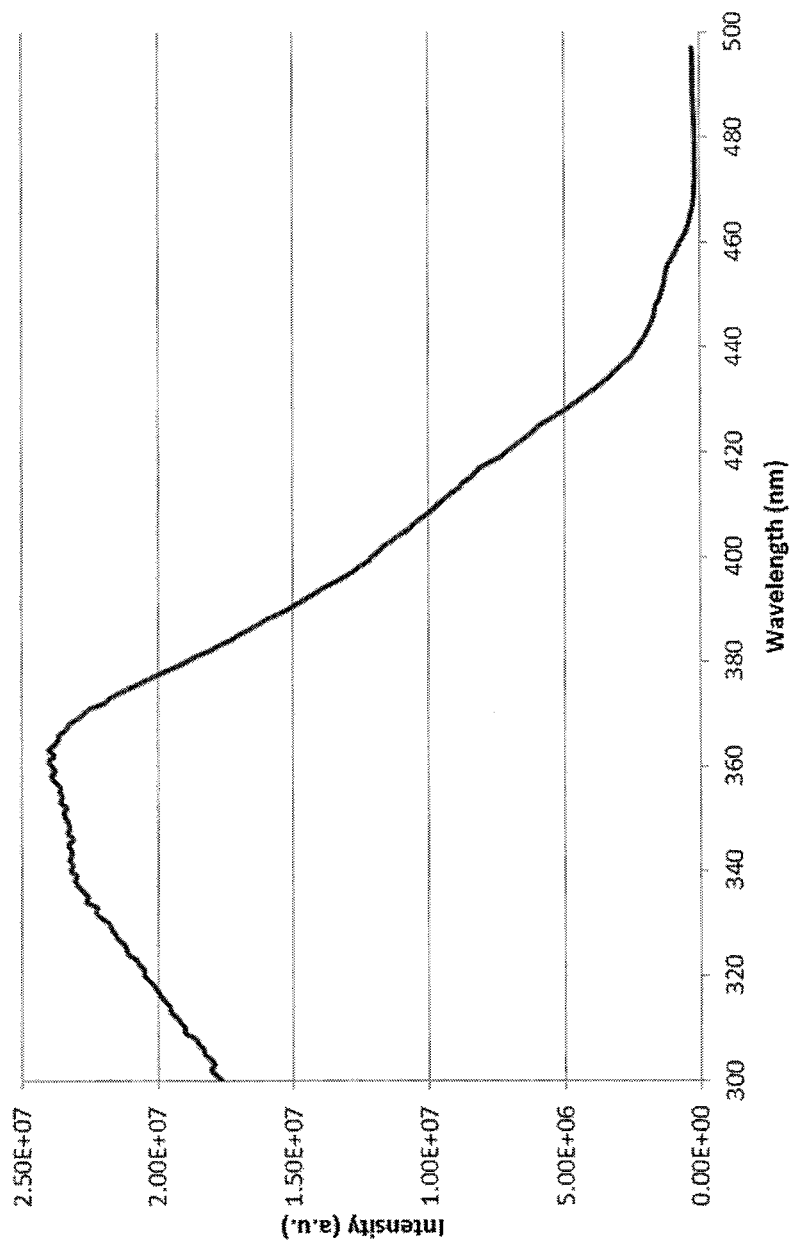
FIG. 18 is the excitation spectrum of the phosphor with the emission spectrum of FIG. 15.

FIG. 17 is an emission spectrum of a narrow band green phosphor of the present invention represented by the formula $Eu_{1.0}Mg_{0.8}Mn_{0.2}Al_{10}O_{17}$ under excitation by a 400 nm LED; and FIG. 18 is the excitation spectrum of the same phosphor, showing efficient excitation for the green phosphor by a near UV LED emitting radiation at a wavelength of about 300 to 410 nm.

Furthermore, in embodiments, the green phosphor may have a composition given by the formula $M_{1-x}Eu_xMg_{1-y}Mn_yAl_{10}O_7$, wherein M may be at least one of Ba and Sr, and in embodiments M may be Ba, and wherein $0.1 \leq x \leq 0.5$ and $0.2 \leq y \leq 0.5$, in embodiments $0.3 \leq x \leq 0.5$ and $0.3 \leq y \leq 0.5$, and in further embodiments the composition is given by any one of the second through thirteenth formulas provided in Table 3, including the formula $Ba_{0.6}Eu_{0.4}Mg_{0.6}Mn_{0.4}Al_{10}O_{17}$.

Table 3 summarizes the testing results of narrow band green phosphors of the present invention with general composition of $M_{1-x}Eu_xMg_{1-y}Mn_yAl_{10}O_{17}$ illuminated by a 400 nm LED—the peak emission wavelength from the photoluminescence curve, the full width at half maximum (FWHM) of the photoluminesence peak, the CIE coordinates and the relative brightness (all measured relative to a standard) are all provided.

TABLE 3

| Phosphor | Wavelength (nm) | FWHM (nm) | CIE x | CIE y | Brightness (a.u.) |
| --- | --- | --- | --- | --- | --- |
| $Eu_1Mn_{0.2}Mg_{0.8}Al_{10}O_{17}$ | 518 | 29 | 0.155 | 0.720 | 140% |
| $Eu_{0.1}Ba_{0.9}Mn_{0.2}Mg_{0.8}Al_{10}O_{17}$ | 516 | 26.6 | 0.140 | 0.751 | 110% |
| $Eu_{0.1}Ba_{0.9}Mn_{0.3}Mg_{0.7}Al_{10}O_{17}$ | 517 | 27 | 0.147 | 0.751 | 110% |
| $Eu_{0.1}Ba_{0.9}Mn_{0.4}Mg_{0.6}Al_{10}O_{17}$ | 517 | 27 | 0.153 | 0.750 | 94% |
| $Eu_{0.2}Ba_{0.8}Mn_{0.3}Mg_{0.7}Al_{10}O_{17}$ | 517 | 27.5 | 0.151 | 0.747 | 131% |

TABLE 3-continued

| Phosphor | Wavelength (nm) | FWHM (nm) | CIE x | CIE y | Brightness (a.u.) |
|---|---|---|---|---|---|
| $Eu_{0.2}Ba_{0.8}Mn_{0.4}Mg_{0.6}Al_{10}O_{17}$ | 517 | 28 | 0.158 | 0.749 | 139% |
| $Eu_{0.2}Ba_{0.8}Mn_{0.5}Mg_{0.5}Al_{10}O_{17}$ | 517.5 | 29 | 0.168 | 0.744 | 126% |
| $Eu_{0.16}Ba_{0.84}Mn_{0.4}Mg_{0.6}Al_{10}O_{17}$ | 517 | 28 | 0.160 | 0.744 | 119% |
| $Eu_{0.24}Ba_{0.76}Mn_{0.4}Mg_{0.6}Al_{10}O_{17}$ | 517 | 28 | 0.161 | 0.746 | 134% |
| $Eu_{0.3}Ba_{0.7}Mn_{0.4}Mg_{0.6}Al_{10}O_{17}$ | 517 | 28 | 0.159 | 0.749 | 143% |
| $Eu_{0.4}Ba_{0.6}Mn_{0.5}Mg_{0.5}Al_{10}O_{17}$ | 518 | 28.7 | 0.167 | 0.748 | 150% |
| $Eu_{0.4}Ba_{0.6}Mn_{0.4}Mg_{0.6}Al_{10}O_{17}$ | 518 | 28 | 0.167 | 0.744 | 163% |
| $Eu_{0.5}Ba_{0.5}Mn_{0.4}Mg_{0.6}Al_{10}O_{17}$ | 519 | 28 | 0.166 | 0.744 | 163% |

In some embodiments the phosphor package comprises at least one narrow band green phosphor with a photoluminescence peak with a full width at half maximum of less than 60 nm, and wherein the narrow band green phosphor is configured to emit photoluminescence in wavelengths ranging from about 500 nm to about 550 nm under excitation from the a UV source with a wavelength ranging from about 250 nm to about 410 nm. Furthermore, in embodiments the full width at half maximum of the photoluminescence peak of the at least one narrow band green phosphor is less than 50 nm, in embodiments less than 40 nm, and in some embodiments less than 30 nm.

In further embodiments, the white light illumination system may include other green phosphors in addition to, or instead of the narrow band green phosphor described above. Other green phosphors may include: a composition given by the formula $Mn:Zn_2SiO_4$; a composition given by the formula $Mn:ZnS$; a composition given by the formula $LaPO_4:Ce,Tb$; and a composition given by the formula $(Ce,Tb)MgAl_{11}O_{19}:Ce,Tb$. However, these other narrow band green phosphors do not exhibit as high an excitation efficiency in the UV and near UV part of the spectrum as the exemplary narrow band green phosphors of the present invention.

Note that the green phosphor a β-SiAlON having a composition given by the formula $Eu^{2+}:Si_{6-z}Al_zO_zN_{8-z}$ may also be used in the white light illumination system of the present invention, although the FWHM of the photoluminescence peak at around 55 nm is not as desirable as the narrow band green phosphors of the present invention such as those provided in Table 3.

Color LCD Display

Figure 19:
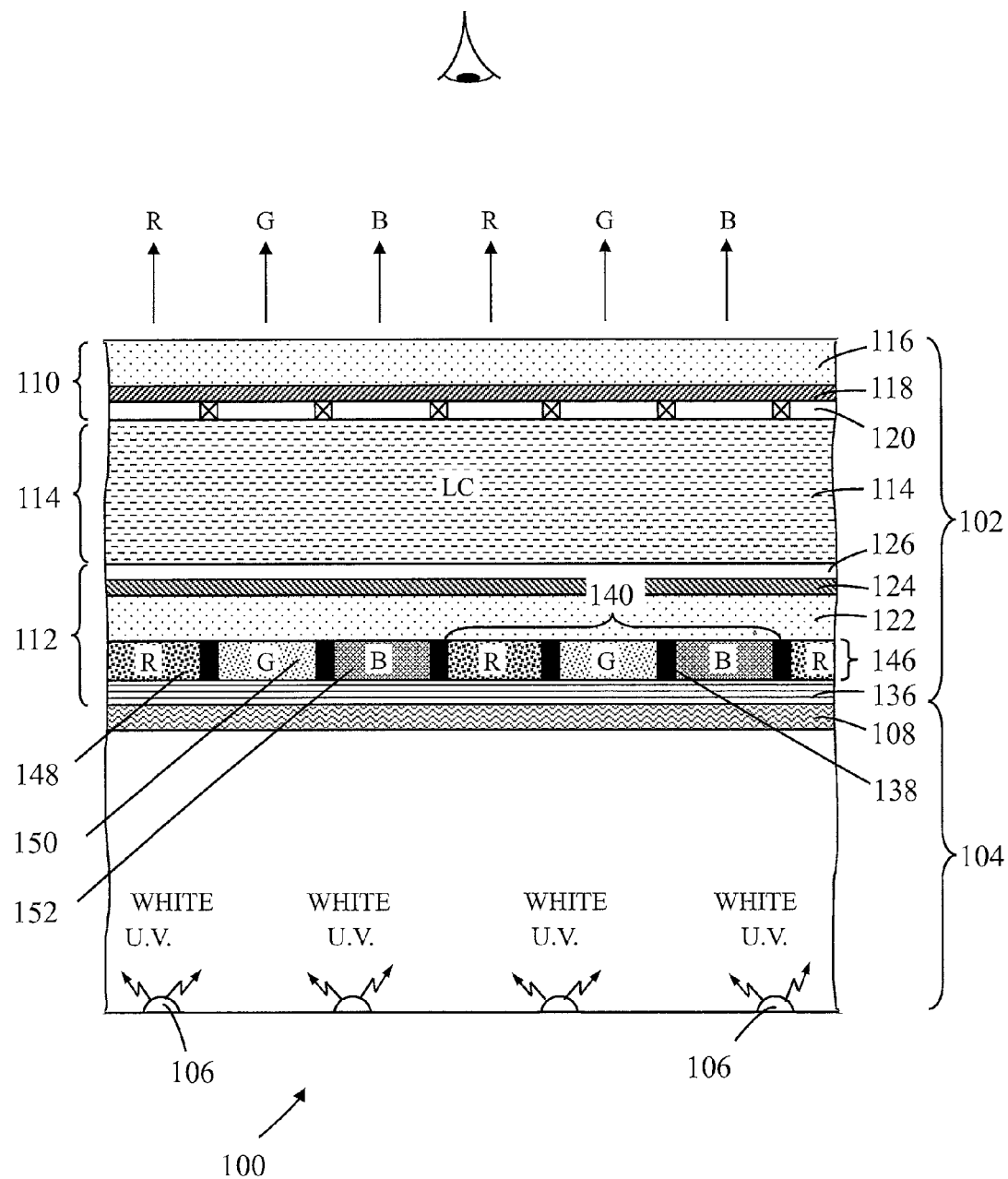
FIG. 19 is a schematic cross-sectional representation of a color liquid crystal display according to embodiments of the invention.

Referring to FIG. 19 there is shown a schematic cross-sectional representation of a color LCD 100 according to embodiments of the invention. The color LCD 100 comprises a display panel 102 and a backlighting unit 104.

The backlighting unit 104 comprises either a single white light source or a plurality of white light sources 106 and a light diffusing plane 108. Each white light source 106 is a white light illumination system such as described herein above (FIGS. 11 through 13), that is operable to emit white light with a specified chromaticity color gamut. The light diffusing plane 108 ensures the display panel 102 is substantially evenly irradiated with white light over its entire surface.

The display panel 102 comprises a transparent (light transmissive) front (light/image emitting) plate 110, a transparent back plate 112 and a liquid crystal (LC) 114 filling the volume between the front and back plates. The front plate 110 comprises a glass plate 116 having on its underside, that is the face of the plate facing the LC 114, a first polarizing filter layer 118 and then a thin film transistor (TFT) layer 120. The back plate 112 comprises a glass plate 122 having a second polarizing filter layer 124 and a transparent common electrode plane 126 (for example transparent indium tin oxide, ITO) on its upper surface facing the LC and a color filter plate 146 on its underside facing the backlighting unit 104. Additionally, the back plate 112 can further comprise a wavelength selective filter 136 located between the color filter plate 146 and the backlighting unit 104. The function of the wavelength selective filter plate is described in further detail in U.S. Patent Appl. Pub. No. 2012/0287381, incorporated by reference in its entirety herein.

The TFT layer 120 comprises an array of TFTs, wherein there is a transistor corresponding to each individual color filter sub-pixel 148, 150, 152 of each pixel unit 140 of the color filter plate 146. Typically the directions of polarization of the two polarizing filters 118, 124 are aligned perpendicular to one another.

Figure 20:
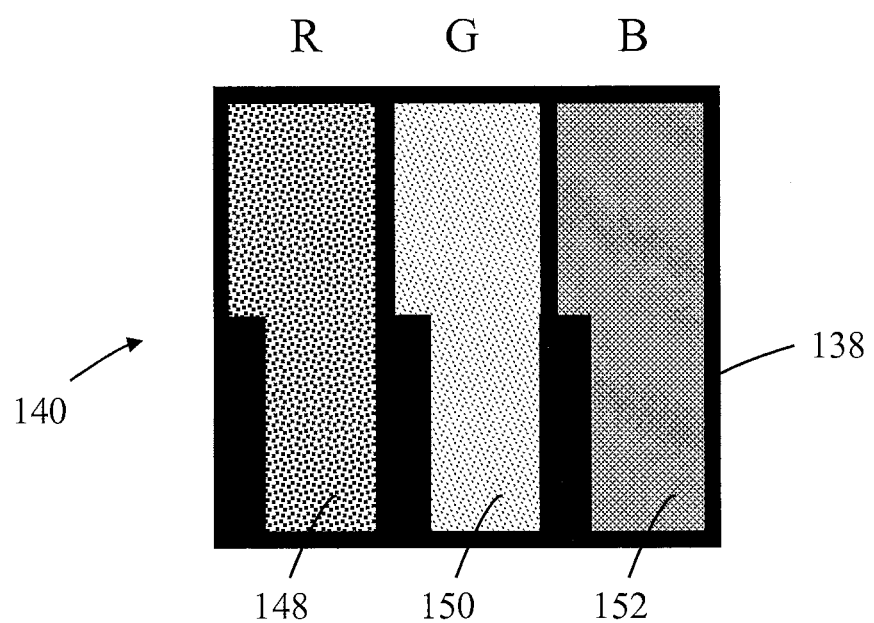
FIG. 20 is a schematic diagram of a unit pixel of a color filter plate of the display of FIG. 19.

The RGB color filters are packaged/configured on the color filter plate 146 as illustrated in FIG. 20 which shows a RGB unit pixel 140 of the color filter plate 146 comprising a sub-pixel triplet filled by three color filters 148, 150, 152. A grid mask (also termed a black matrix) 138 of metal, such as for example chromium, defines the color filter elements (sub-pixels) 148, 150, 152 and provides an opaque gap between the sub-pixels and unit pixels. Additionally the black matrix shields the TFTs from stray light and prevents cross-talk between neighboring sub-pixels/unit pixels. To minimize reflection from the black matrix 138, a double layer of Cr and CrOx may be used, but of course, the layers may comprise materials other than Cr and CrOx. The black matrix film which can be sputter-deposited underlying or overlying the photoluminescence material may be patterned using methods that include photolithography.

Figure 21:
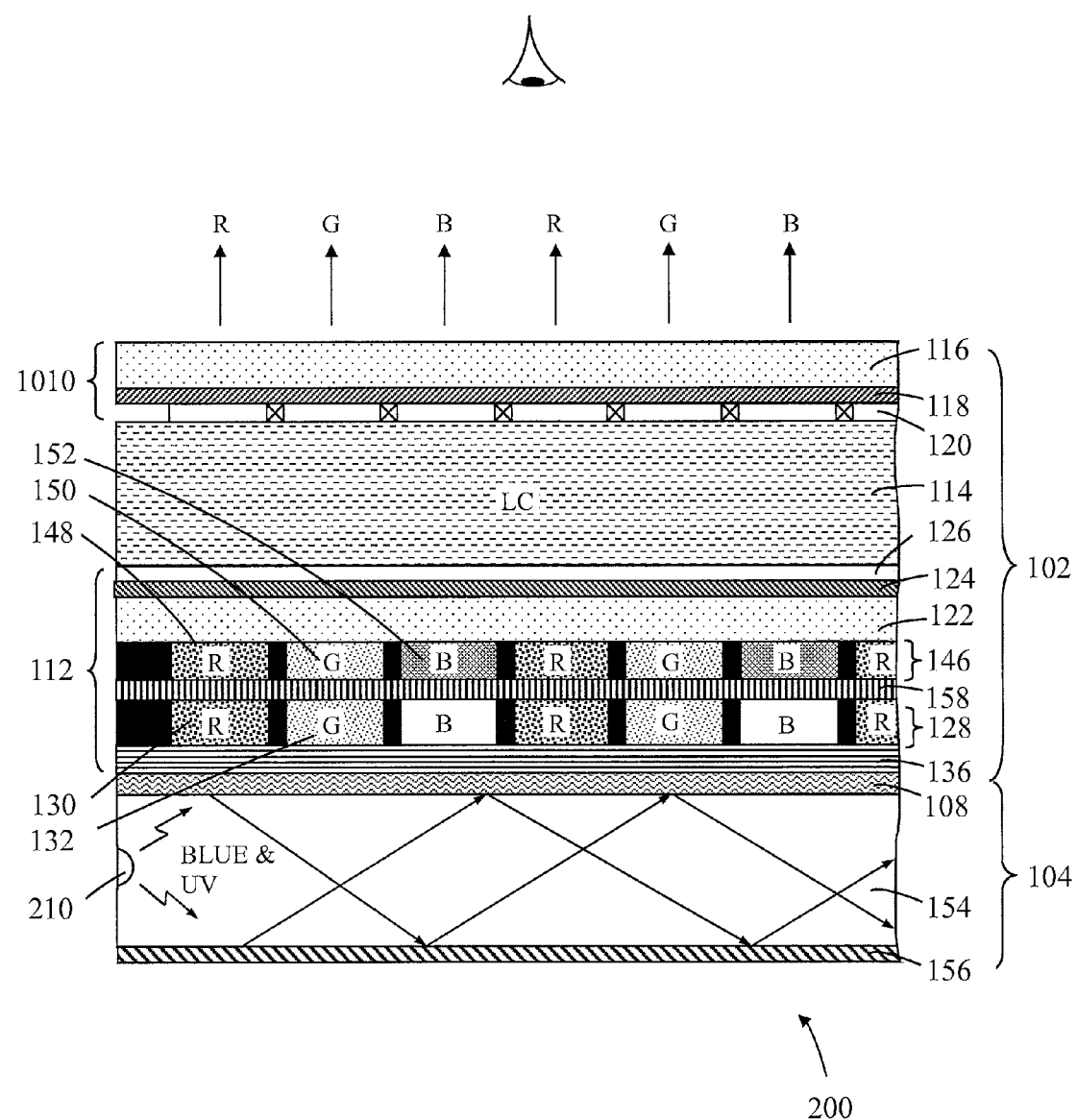
FIG. 21 is a schematic cross-sectional representation of a photoluminescence color LCD according to some further embodiments of the invention.

In a further embodiment, as illustrated in FIG. 21, the back plate 112 further includes a photoluminescence color-elements plate 128. The color-element plate 128 includes an array of red 130 and green 132 light emitting photoluminescence materials in which each color-element corresponds to a respective color sub-pixel in the display. As with embodiment of FIG. 19 the display can further comprise a color filter plate 146 comprising an array of red 148, green 150 and blue 152 color filter elements in which each filter element corresponds to a respective color sub-pixel in the display. The color filter plate can be configured such that a red color filter element 148 is positioned overlaying a red photoluminescence color-element 130 in the color-element plate for displaying a red sub-pixel; a green color filter element 150 is positioned overlaying a green photoluminescence color-element 132 in the color-element plate for displaying a green sub-pixel; and a blue color filter element 152 is positioned overlaying a blue photoluminescence color-element 134 in the color-element plate for displaying a blue sub-pixel. Typically the blue color-element 134 does not include a photoluminescence material where the backlight comprises a blue excitation source. In other embodiments the color-elements plate may include a photoluminescence material corresponding to blue sub-pixels of the display. The function of the color filter plate 146 is to define the spectral band width of each sub-pixel and to prevent unconverted excitation radiation being emitted from pixel areas containing a photoluminescence material. Such a color filter plate can be especially beneficial for photoluminescence displays that utilize quantum dots materials since it can be difficult to guarantee 100% conversion of excitation light to photoluminescence light. The color filter plate can comprise the color filter plate of a known display that uses a white backlight. Typically the various filter areas comprise a band pass filter with a pass band corresponding to the color of light emitted by each pixel area. Such filters not only prevent the transmission of unconverted excitation radiation but additionally can be used to narrow and/or fine tune the emission color of the pixel areas to optimize the performance of the display.

In the embodiment illustrated in FIG. 21 the backlighting unit 104 comprises a planar light guide (waveguide) 154 with one or more blue and UV co-excitation sources 210 located along one or more edges of the light guide 154. In operation excitation light is coupled into the edge(s) of the light guide and is guided, by total internal reflection, over the entire volume of the light guide to give a uniform illumination over the entire surface of the display panel. As shown and to prevent the escape of light from the backlight unit the rear of the light guide can further comprise a light reflective surface 156.

The photoluminescence material elements in the photoluminescence color-elements plate 128 can absorb the excitation blue and UV light and emit light in colors corresponding to the display requirements. The color filter can improve the display by filtering out light in different colors, such as the backlight and/or incident light from other color elements.

Additionally, the back plate 112 can further comprise a wavelength selective filter 136 positioned between the photoluminescence color-elements plate 138 and the backlighting unit 210, and a Hoffman filter 158 that can guide the emitted light from photoluminescence color-element toward the color filter.

The photoluminescence color-elements plate 128 comprises an array of different photoluminescence color-elements (sub-pixels) 130, 132, 134 which emit red (R), green (G), and blue (B) light respectively in response to UV and/or blue excitation radiation from the backlighting unit 210. In some embodiments, only red 130 and green 132 photoluminescence materials are incorporated in the photoluminescence color-elements plate 128 since the blue excitation light may also serve as the third of the three primary colors that are essential for color rendering. The photoluminescence materials may be inorganic phosphors, such as described herein above, organic phosphors, and/or materials comprising quantum dots, all of which emit light of different colors, with a certain spectral width centered at a peak wavelength, when excited.

Figure 22:
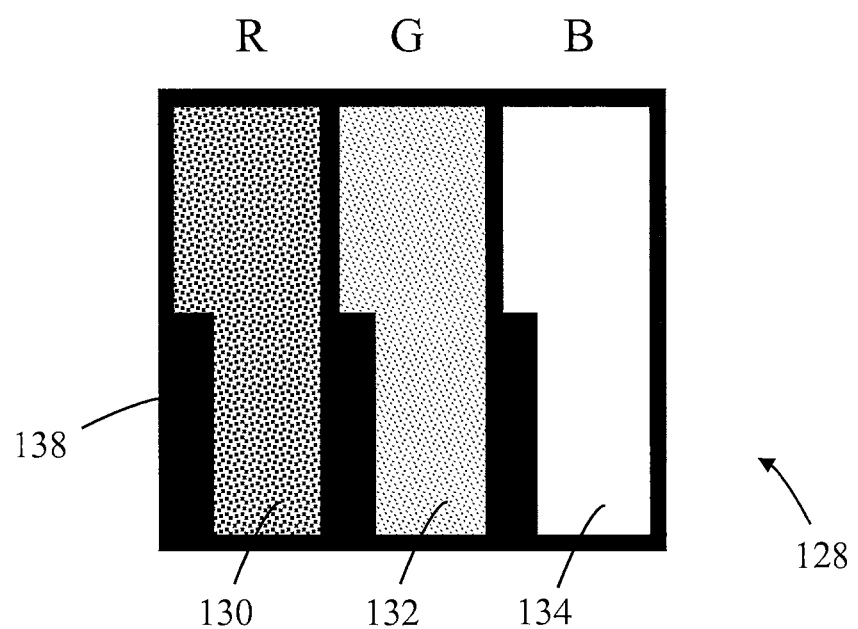
FIG. 22 is a schematic diagram of a unit pixel of a photoluminescent color-elements plate of the display of FIG. 21.

The RGB photoluminescence color-elements can be packaged/configured on the photoluminescence color-elements plate 138 to correspond with the color filters of the color filter plate 146. The arrangement of elements of the photoluminescence color-elements plate 128 is illustrated in FIG. 22 which shows a RGB unit pixel 140 of the photoluminescence color-elements plate 128 comprising a sub-pixel triplet filled by two photoluminescence color-elements 130, 132 with emissions centered at the primary red (R) and green (G) colors for UV and blue co-excited photoluminescence materials, such as phosphors and/or quantum dots. A grid mask (also termed a black matrix) 138 of metal, such as for example chromium, defines the photoluminescence color-elements (sub-pixels) 130, 132, 134 and provides an opaque gap between the photoluminescence sub-pixels and unit pixels. Additionally the black matrix shields the TFTs from stray light and prevents crosstalk between neighboring sub-pixels/unit pixels. To minimize reflection from the black matrix 138, a double layer of Cr and CrOx may be used, but of course, the layers may comprise materials other than Cr and CrOx. The black matrix film which can be sputter-deposited underlying or overlying the photoluminescence material may be patterned using methods that include photolithography. As described above, in some embodiments, only red 130 and green 132 photoluminescence materials are incorporated in the photoluminescence color-elements plate 128 since the blue excitation light may also serve as the third of the three primary colors that are essential for color rendering.

Fabrication of a color display of the present invention as described above with reference to FIGS. 19-22, are based on processes well known to those skilled in the art of LCD display fabrication. The photoluminescence color-elements plate 128 may be fabricated using a combination of lithography and deposition techniques known to those skilled in the art of display fabrication.

The narrow band green phosphors of the present invention are well suited to LCD applications due to (1) the emission wavelength being within 10 or 20 nm of the center of typical green filters (about 530 nm), and (2) the FWHM of the photoluminescence peak of the narrow band green phosphors described herein, particularly those phosphors with FWHM of less than 30 nm, including the phosphors listed in Table 3 above, being able to fit within the high transmission region (roughly greater than 90% transmission) of the typical green filter which extends from about 500 nm to about 550 nm.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A white light illumination system comprising:
   a phosphor package;
   a first radiation source for providing co-excitation radiation to the phosphor package, the source emitting in wavelengths ranging from about 250 nm to about 410 nm;
   a second radiation source for providing co-excitation radiation to the phosphor package, the source emitting in wavelengths ranging from about 410 nm to about 540 nm; and
   wherein the phosphor package is configured to emit photoluminescence comprising light with wavelengths ranging from about 440 nm to about 700 nm upon co-excitation from the first and second radiation sources, and wherein the phosphor package comprises at least one narrow band green phosphor with a photoluminescence peak with a full width at half maximum of less than 60 nm, and wherein the narrow band green phosphor is configured to emit photoluminescence in wavelengths ranging from about 500 nm to about 550 nm.

2. The white light illumination system of claim 1, wherein the full width at half maximum of the photoluminescence peak of the at least one narrow band phosphor is less than 50 nm.

3. The white light illumination system of claim 1, wherein the full width at half maximum of the photoluminescence peak of the at least one narrow band phosphor is less than 40 nm.

4. The white light illumination system of claim 1, wherein the full width at half maximum of the photoluminescence peak of the at least one narrow band phosphor is less than 30 nm.

5. The white light illumination system of claim 1, wherein the first radiation source and the second radiation source are part of a multi-chip excitation source.

6. The white light illumination system of claim 1, wherein the green phosphor has a composition given by the formula $M_aEu_{1-a}Al_bO_c$, wherein:
M is at least one divalent metal selected from the group consisting of Mg, Ca, Sr, Ba, Mn, Zn, Cu, Cd, Sm and Tm;
$0<a\leq1.0$;
$0.5\leq b\leq12.0$; and
$1.75\leq c\leq19.0$.

7. The white light illumination system of claim 1, wherein the green phosphor has a composition given by the formula $M_{1-x}Eu_xMg_{1-y}Mn_yAl_{10}O_{17}$, wherein:
M is at least one alkaline earth metal;
$0.01<x\leq1.0$; and
$0.01<y\leq1.0$.

8. The white light illumination system of claim 7, wherein x=1.

9. The white light illumination system of claim 8, wherein $0.1\leq y\leq0.7$.

10. The white light illumination system of claim 8, wherein $0.2\leq y\leq0.4$.

11. The white light illumination system of claim 7, wherein M is at least one of Ba and Sr.

12. The white light illumination system of claim 11, wherein $0.1\leq x\leq0.5$ and $0.25\leq y\leq0.5$.

13. The white light illumination system of claim 11, wherein $0.3\leq x\leq0.5$ and $0.3\leq y\leq0.5$.

14. The white light illumination system of claim 7, wherein the composition is given by the formula $Ba_{0.6}Eu_{0.4}Mg_{0.6}Mn_{0.4}Al_{10}O_{17}$.

15. The white light illumination system of claim 1, wherein the phosphor package further comprises a red phosphor configured to emit photoluminescence in wavelengths ranging from about 600 nm to about 700 nm.

16. The white light illumination system of claim 15, wherein the white light illumination emitted by the system covers an area including greater than 90% of NTSC 1953 color gamut specification as mapped on CIE 1931 xy chromaticity diagram.

17. The white light illumination system of claim 15, wherein the green phosphor has chromaticity coordinates CIE (x, y) within an area of CIE 1931 xy chromaticity diagram defined by a simple quadrilateral with vertices (0.120, 0.775), (0.230, 0.755), (0.360, 0.620) and (0.150, 0.650).

18. The white light illumination system of claim 15, wherein the green phosphor has chromaticity coordinates CIE (x, y) within an area of CIE 1931 xy chromaticity diagram defined by a simple quadrilateral with vertices (0.128, 0.768), (0.205, 0.753), (0.278, 0.660) and (0.150, 0.680).

19. The white light illumination system of claim 15, wherein the green phosphor has chromaticity coordinates CIE (x, y) within an area of CIE 1931 xy chromaticity diagram defined by a simple quadrilateral with vertices (0.135, 0.760), (0.180, 0.750), (0.195, 0.700) and (0.150, 0.710).

20. The white light illumination system of claim 15, wherein the red phosphor has chromaticity coordinates CIE (x, y) within an area of CIE 1931 xy chromaticity diagram defined by a simple quadrilateral with vertices (0.61, 0.39), (0.70, 0.30), (0.68, 0.30) and (0.59, 0.39).

21. The white light illumination system of claim 1, wherein the first radiation source emits in wavelengths ranging from about 390 nm to about 410 nm.

22. The white light illumination system of claim 1, wherein the second radiation source emits in wavelengths ranging from about 445 nm to about 455 nm.

23. The white light illumination system of claim 1, wherein the phosphor package is encapsulated with the first and second radiation sources.

24. The white light illumination system of claim 1, wherein the phosphor package is remote from the first and second radiation sources.

25. The white light illumination system of claim 1, wherein the white light illumination system is a display backlighting system.

26. The white light illumination system of claim 1, wherein a final light product generated by the white light illumination system comprises photoluminescence from the phosphor package and light generated by the second radiation source, but not light generated by the first radiation source.

27. A white light illumination system comprising:
a phosphor package;
a first radiation source for providing co-excitation radiation to the phosphor package, the source emitting in wavelengths ranging from about 250 nm to about 410 nm;
a second radiation source for providing co-excitation radiation to the phosphor package, the source emitting in wavelengths ranging from about 410 nm to about 540 nm; and
wherein the phosphor package is configured to emit photoluminescence comprising light with wavelengths ranging from about 440 nm to about 700 nm upon co-excitation from the first and second radiation sources, and wherein the phosphor package comprises a green phosphor with chromaticity coordinates CIE (x, y) within an area of CIE 1931 xy chromaticity diagram defined by a simple quadrilateral with vertices (0.61, 0.39), (0.70, 0.30), (0.68, 0.30) and (0.59, 0.39).

28. The white light illumination system of claim 27, wherein said phosphor package further comprises a red phosphor, said red phosphor having chromaticity coordinates CIE (x, y) within an area of CIE 1931 xy chromaticity diagram defined by a simple quadrilateral with vertices (0.61, 0.39), (0.70, 0.30), (0.68, 0.30) and (0.59, 0.39).

29. A color display comprising:
a display panel comprising a plurality of red, green and blue pixel areas;
a white light illumination system; and
a color filter plate located on a side of the display panel that is distal to the white light illumination system, wherein the color filter plate comprises at least one of: first filter areas corresponding to red pixel areas of the display that are operable to allow the passage of red light; second filter areas corresponding to green pixel areas of the display that are operable to allow the passage of green light; and third filter areas corresponding to blue pixel areas of the display that are operable to allow the passage of blue light;
wherein the white light illumination system comprises:
a phosphor package;
a first radiation source for providing co-excitation radiation to the phosphor package, the source emitting in wavelengths ranging from about 250 nm to about 410 nm;

a second radiation source for providing co-excitation radiation to the phosphor package, the source emitting in wavelengths ranging from about 410 nm to about 540 nm; and wherein the phosphor package is configured to emit photoluminescence in wavelengths ranging from about 440 nm to about 700 nm upon co-excitation from the first and second radiation sources, and wherein the phosphor package comprises at least one narrow band green phosphor with a photoluminescence peak with a full width at half maximum of less than 60 nm, and wherein the narrow band green phosphor is configured to emit photoluminescence in wavelengths ranging from about 500 nm to about 550 nm.

30. A photoluminescence color display comprising:

a display panel comprising a plurality of red, green and blue pixel areas;

an excitation source operable to generate excitation radiation for operating the display, said excitation source comprising:

a first radiation source emitting in wavelengths ranging from about 250 nm to about 410 nm;

a second radiation source emitting in wavelengths ranging from about 410 nm to about 540 nm;

a photoluminescence color-elements plate comprising at least one of: a first photoluminescence material corresponding to red pixel areas of the display that is operable to emit red light in response to said excitation radiation; a second photoluminescence material corresponding to green pixel areas of the display that is operable to emit green light in response to said excitation radiation; and a third photoluminescence material corresponding to blue pixel areas of the display that is operable to emit blue light in response to said excitation radiation; and a color filter plate located on a side of the display panel that is distal to the white light illumination system, wherein the color filter plate comprises at least one of: first filter areas corresponding to red pixel areas of the display that are operable to allow the passage of red light; second filter areas corresponding to green pixel areas of the display that are operable to allow the passage of green light; and third filter areas corresponding to blue pixel areas of the display that are operable to allow the passage of blue light;

wherein the second photoluminescence material comprises at least one narrow band green phosphor with a photoluminescence peak with a full width at half maximum of less than 60 nm, and wherein the narrow band green phosphor is configured to emit photoluminescence in wavelengths ranging from about 500 nm to about 550 nm.

* * * * *